US011720248B2

(12) United States Patent
Chirca et al.

(10) Patent No.: US 11,720,248 B2
(45) Date of Patent: Aug. 8, 2023

(54) CONFIGURABLE CACHE FOR MULTI-ENDPOINT HETEROGENEOUS COHERENT SYSTEM

(71) Applicant: TEXAS INSTRUMENTS INCORPORATED, Dallas, TX (US)

(72) Inventors: Kai Chirca, Dallas, TX (US); Matthew David Pierson, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/715,022

(22) Filed: Apr. 6, 2022

(65) Prior Publication Data

US 2022/0229779 A1    Jul. 21, 2022

Related U.S. Application Data

(63) Continuation of application No. 16/653,263, filed on Oct. 15, 2019, now Pat. No. 11,307,988.

(Continued)

(51) Int. Cl.
*G06F 12/00* (2006.01)
*G06F 3/06* (2006.01)
(Continued)

(52) U.S. Cl.
CPC ............ *G06F 3/0604* (2013.01); *G06F 3/064* (2013.01); *G06F 3/0607* (2013.01); *G06F 3/0632* (2013.01); *G06F 3/0658* (2013.01); *G06F 3/0659* (2013.01); *G06F 3/0673* (2013.01); *G06F 3/0679* (2013.01); *G06F 9/30101* (2013.01); *G06F 9/30123* (2013.01); *G06F 9/3897* (2013.01); *G06F 9/4881* (2013.01); *G06F 9/5016* (2013.01); *G06F 12/0607* (2013.01); *G06F 12/084* (2013.01); *G06F 12/0811* (2013.01); *G06F 12/0815* (2013.01); *G06F 12/0828* (2013.01); *G06F 12/0831* (2013.01); *G06F 12/0855* (2013.01); *G06F 12/0857* (2013.01); *G06F 12/0875* (2013.01); *G06F 12/0891* (2013.01); *G06F 12/10* (2013.01); *G06F 12/1009* (2013.01); *G06F 13/124* (2013.01); *G06F 13/1642* (2013.01); *G06F 13/1663* (2013.01);
(Continued)

(58) Field of Classification Search
CPC .. G06F 12/0238; G06F 3/0604; G06F 3/0655; G06F 3/0673; G06F 12/0802; G06F 12/1054; G06F 12/1063; G06F 2212/72
See application file for complete search history.

(56) References Cited

U.S. PATENT DOCUMENTS 8,732,370 B2   5/2014  Chirca et al.
9,152,586 B2  10/2015  Wu et al.
(Continued)

*Primary Examiner* — Gurtej Bansal
(74) *Attorney, Agent, or Firm* — Carl G. Peterson; Frank D. Cimino

(57) ABSTRACT

A device includes a memory bank. The memory bank includes data portions of a first way group. The data portions of the first way group include a data portion of a first way of the first way group and a data portion of a second way of the first way group. The memory bank further includes data portions of a second way group. The device further includes a configuration register and a controller configured to individually allocate, based on one or more settings in the configuration register, the first way and the second way to one of an addressable memory space and a data cache.

20 Claims, 18 Drawing Sheets

Related U.S. Application Data

(60) Provisional application No. 62/745,842, filed on Oct. 15, 2018.

(51) Int. Cl.

| | | |
|---|---|---|
| G06F 12/084 | (2016.01) | |
| G06F 12/0811 | (2016.01) | |
| G06F 12/1009 | (2016.01) | |
| G06F 12/0875 | (2016.01) | |
| G06F 12/10 | (2016.01) | |
| G06F 13/16 | (2006.01) | |
| G06F 13/40 | (2006.01) | |
| G06F 12/0855 | (2016.01) | |
| G06F 12/06 | (2006.01) | |
| G06F 12/0817 | (2016.01) | |
| G06F 12/0831 | (2016.01) | |
| G06F 13/12 | (2006.01) | |
| G06F 12/0815 | (2016.01) | |
| H03M 13/01 | (2006.01) | |
| H03M 13/09 | (2006.01) | |
| H03M 13/15 | (2006.01) | |
| H03M 13/27 | (2006.01) | |
| G06F 9/30 | (2018.01) | |
| G06F 9/38 | (2018.01) | |
| G06F 9/48 | (2006.01) | |
| G06F 9/50 | (2006.01) | |
| G06F 12/0891 | (2016.01) | |
| G06F 12/0846 | (2016.01) | |
| G06F 12/0862 | (2016.01) | |

(52) U.S. Cl.
CPC ...... *G06F 13/1668* (2013.01); *G06F 13/4027* (2013.01); *H03M 13/015* (2013.01); *H03M 13/098* (2013.01); *H03M 13/1575* (2013.01); *H03M 13/276* (2013.01); *H03M 13/2785* (2013.01); *G06F 12/0833* (2013.01); *G06F 12/0846* (2013.01); *G06F 12/0851* (2013.01); *G06F 12/0862* (2013.01); *G06F 2212/1008* (2013.01); *G06F 2212/1016* (2013.01); *G06F 2212/1024* (2013.01); *G06F 2212/1048* (2013.01); *G06F 2212/304* (2013.01); *G06F 2212/452* (2013.01); *G06F 2212/6024* (2013.01); *G06F 2212/657* (2013.01)

(56) References Cited

U.S. PATENT DOCUMENTS

| | | |
|---|---|---|
| 9,298,665 B2 | 3/2016 | Pierson et al. |
| 9,652,404 B2 | 5/2017 | Pierson et al. |
| 10,489,300 B1 | 11/2019 | Nampoothiri et al. |
| 2007/0094664 A1 | 4/2007 | So et al. |
| 2008/0201528 A1 | 8/2008 | Hsu et al. |
| 2011/0252179 A1 | 10/2011 | Cho et al. |
| 2012/0005439 A1 | 1/2012 | Ukai |
| 2020/0057692 A1 | 2/2020 | Payet et al. |

| ENDPOINT | COMMAND TYPE | SNOOP FILTER STATE | SNOOP | SNOOP DATA RETURN | SRAM | EXTERNAL ACCESS |
|---|---|---|---|---|---|---|
| SRAM/ L3 CACHE DATA HIT | READ | INVALID | NO | - | YES | - |
| | | SHARED | NO | - | YES | - |
| | | UNIQUE | YES | YES | NO | - |
| | WRITE | | | NO | YES | - |
| | | INVALID | NO | - | YES | - |
| | | SHARED | YES | - | YES | - |
| | | UNIQUE | YES | - | YES | - |
| L3 CACHE DATA MISS | READ | INVALID | NO | - | - | YES |
| | | SHARED | YES | YES | - | NO |
| | | | | NO | - | YES |
| | | UNIQUE | YES | YES | - | NO |
| | | | | NO | - | YES |
| | WRITE | INVALID | NO | - | - | YES |
| | | SHARED | YES | - | - | YES |
| | | UNIQUE | YES | - | - | YES |

FIG. 7

CONFIGURABLE CACHE FOR MULTI-ENDPOINT HETEROGENEOUS COHERENT SYSTEM

CROSS-REFERENCE TO RELATED APPLICATIONS

This application is a continuation of U.S. patent application Ser. No. 16/653,263 filed Oct. 15, 2019, which claims priority to U.S. Provisional Application No. 62/745,842 filed Oct. 15, 2018, all of which are hereby incorporated by reference.

BACKGROUND

Multi-core systems provide shared access to one or more memory devices. A core connected to such a system may implement its own data cache which stores (i.e., "caches") data from the one or more memory devices as the core accesses the data so that the core need not send a request out to the one or more memory devices each time the data is used. In such systems multiple processing cores occasionally access the same memory address in the shared memory devices which may lead to coherency issues. For example, if a first core stores cached data from address "Z" of the shared memory devices and modifies the cached data without committing the modified data back to the shared memory devices, a second core reading from the address "Z" may receive out of date data. Some multi-core systems provide coherency using software cache maintenance operations. However, such operations may lead to operational inefficiencies (e.g., may be slow or consume excessive amounts of operational time). Further, multi-core systems may present additional challenges.

SUMMARY

Various systems and methods for providing multi-core coherent systems are disclosed herein.

In one implementation, a device includes a snoop filter bank, a cache tag bank, and a memory bank. The cache tag bank is connected to both the cache tag bank and the memory bank.

In another implementation, a system includes a multi-core shared memory controller (MSMC). The MSMC includes a snoop filter bank, a cache tag bank, and a memory bank. The cache tag bank is connected to both the cache tag bank and the memory bank. The MSMC further includes a first coherent slave interface connected to a data path that is connected to the snoop filter bank. The MSMC further includes a second coherent slave interface connected to the data path that is connected to the snoop filter bank. The MSMC further includes an external memory master interface connected to the cache tag bank and the memory bank. The system further includes a first processor package connected to the first coherent slave interface and a second processor package connected to the second coherent slave interface. The system further includes an external memory device connected to the external memory master interface.

In another implementation, a method includes receiving, at a multi-core shared memory controller (MSMC), a request from a peripheral device connected to the MSMC to access a memory address. The request corresponds to a read request or to a write request. The method further includes applying, at the MSMC, a tag associated with the memory address to a cache tag bank of the MSMC to identify a snoop filter state of the tag stored in a snoop filter bank connected to the cache tag bank and a cache hit status of the tag in a memory bank connected to the cache tag bank. The method further includes determining whether to issue a snoop request to a device connected to the MSMC based on the snoop filter state and the cache hit status.

A device includes an interconnect and a plurality of devices connected to the interconnect. The plurality of devices includes a first interface connected to the interconnect and a second interface connected to the interconnect. The plurality of devices further includes a first memory bank connected to the interconnect and a second memory bank connected to the interconnect. The plurality of devices further includes an external memory interface connected to the interconnect and a controller configured to establish virtual channels among the plurality of devices connected to the interconnect.

A system includes a multi-core shared memory controller (MSMC) that includes an interconnect and a plurality of devices connected to the interconnect. The plurality of devices includes a first interface connected to the interconnect and a second interface connected to the interconnect. The plurality of devices further includes a first memory bank connected to the interconnect and a second memory bank connected to the interconnect. The plurality of devices further includes an external memory interface connected to the interconnect and a controller configured to establish virtual channels among the plurality of devices connected to the interconnect. The system further includes a first processor package connected to the first interface and a second processor package connected to the second interface. The system further includes an external memory device connected to the external memory interface.

A method includes receiving, at a controller, a message from a first device of a plurality of devices connected to an interconnect. The plurality of devices include a first interface connected to the interconnect, a second interface connected to the interconnect, a first memory bank connected to the interconnect, a second memory bank connected to the interconnect, and an external memory interface connected to the interconnect. The method further includes determining, at the controller, a virtual channel associated with a destination of the message. The method further includes initiating, at the controller, transmission of the message and an identifier of the virtual channel over the interconnect.

A device includes a data path. The device further includes a first interface configured to receive a first memory access request from a first peripheral device. The device further includes a second interface configured to receive a second memory access request from a second peripheral device. The device further includes an arbiter circuit configured to determine a first destination device connected to the data path and associated with the first memory access request and a first credit threshold corresponding to the first memory access request. The arbiter circuit is further configured to determine a second destination device connected to the data path and associated with the second memory access request and a second credit threshold corresponding to the second memory access request. The arbiter circuit is further configured to arbitrate access to the data path by the first memory access request and the second memory access request based on a comparison of the first credit threshold to a first number of credits allocated to the first destination device and a comparison of the second credit threshold to a second number of credits allocated to the second destination device.

A system includes a first processor package, a second processor package, and a multi-core shared memory controller (MSMC). The MSMC includes a data path. The MSMC further includes a first interface connected to the first processor package and configured to receive a first memory access request from the first processor package. The MSMC further includes a second interface connected to the second processor package and configured to receive a second memory access request from the second processor package. The MSMC further includes an arbiter circuit configured to determine a first destination device associated with the first memory access request and a first credit threshold corresponding to the first memory access request. The arbiter circuit is further configured to determine a second destination device associated with the second memory access request and a second credit threshold corresponding to the second memory access request. The arbiter circuit is further configured to arbitrate access to the data path by the first memory access request and the second memory access request based on a comparison of the first credit threshold to a first number of credits allocated to the first destination device and a comparison of the second credit threshold to a second number of credits allocated to the second destination device.

A method includes receiving, at an arbitration circuit, a first memory access request from a first processor package connected to a first interface. The method further includes receiving, at the arbitration circuit, a second memory access request from a second processor package connected to a second interface. The method further includes determining, at the arbitration circuit, a first destination device associated with the first memory access request and a first credit threshold corresponding to the first memory access request. The method further includes determining, at the arbitration circuit, a second destination device associated with the second memory access request and a second credit threshold corresponding to the second memory access request. The method further includes arbitrating, at the arbitration circuit, access to a common data path by the first memory access request and the second memory access request based on a comparison of the first credit threshold to a first number of credits allocated to the first destination device and a comparison of the second credit threshold to a second number of credits allocated to the second destination device.

A device includes a memory bank. The memory bank includes data portions of a first way group. The data portions of the first way group include a data portion of a first way of the first way group and a data portion of a second way of the first way group. The memory bank further includes data portions of a second way group. The device further includes a configuration register and a controller configured to individually allocate, based on one or more settings in the configuration register, the first way and the second way to one of an addressable memory space and a data cache.

A system includes a multi-core shared memory controller (MSMC). The MSMC includes a processor interface and an external memory interface. The MSMC further includes a memory bank. The memory bank includes data portions of a first way group. The data portions of the first way group include a data portion of a first way of the first way group and a data portion of a second way of the first way group. The memory bank further includes data portions of a second way group. The MSMC further includes a configuration register and a controller configured to individually allocate, based on one or more settings in the configuration register, the first way and the second way to one of an addressable memory space and a data cache. The system further includes a processor package connected to the processor interface and an external memory device connected to the external memory interface.

A method includes receiving, at a controller of a multi-core shared memory controller (MSMC), a configuration setting. The MSMC includes a memory bank including data portions of a first way group. The data portions of the first way group include a data portion of a first way of the first way group and a data portion of a second way of the first way group. The memory bank further includes data portions of a second way group. The method further includes allocating, at the controller, the first way and the second way to one of an addressable memory space and a data cache based on the configuration setting.

A device includes a data path. The device further includes a first interface connected to the data path and configured to receive a request from a processor package to write a data value to a memory address. The device further includes a controller connected to the data path and configured to receive the request to write the data value to the memory address. The controller is further configured to calculate a Hamming code of the data value. The controller is further configured to transmit the data value and the Hamming code on the data path. The device further includes an external memory interface. The device further includes an external memory interleave connected to the data path and to the external memory interface. The external memory interleave is configured to receive the data value and calculate a test Hamming code of the data value. The external memory interleave is further configured to determine whether to send the data value to the external memory interface to be written to the memory address based on a comparison of the Hamming code and the test Hamming code.

A system includes a processor package, an external memory device, and a multi-core shared memory controller (MSMC). The MSMC includes a data path and a first interface connected to the data path and the processor package. The first interface is configured to receive a request from the processor package to write a data value to a memory address of the external memory device. The MSMC further includes a controller connected to the data path and configured to receive the request to write the data value to the memory address. The controller is further configured to calculate a Hamming code of the data value. The controller is further configured to transmit the data value and the Hamming code on the data path. The MSMC further includes an external memory interface connected to the external memory device. The MSMC further includes an external memory interleave connected to the data path and to the external memory interface. The external memory interleave is configured to receive the data value and calculate a test Hamming code of the data value. The external memory interleave is further configured to determine whether to send the data value to the external memory interface to be written to the memory address based on a comparison of the Hamming code and the test Hamming code.

A method includes receiving, at a controller of a multi-core shared memory controller (MSMC), a request to write a data value to a memory address of an external memory device connected to the MSMC. The method further includes calculating, a Hamming code of the data value. The method further includes transmitting the data value and the Hamming code to an external memory interleave of the MSMC on a common data path connected to components of the MSMC. The method further includes determining, at the external memory interleave, a test Hamming code based on the data value. The method further includes determining whether to send the data value to the external memory device based on a comparison of the test Hamming code and the Hamming code.

A device includes a data path. The device further includes a first interface configured to receive a first memory access request from a first peripheral device and a second interface configured to receive a second memory access request from a second peripheral device. The device further includes an arbiter circuit configured to, in a first clock cycle determine a first destination device connected to the data path and associated with the first memory access request and a first credit threshold corresponding to the first memory access request. The arbiter circuit is further configured to, in the first clock cycle, determine a second destination device connected to the data path and associated with the second memory access request and a second credit threshold corresponding to the second memory access request. The arbiter circuit is further configured to, in the first clock cycle, select a pre-arbitration winner between the first memory access request and the second memory access request based on a comparison of the first credit threshold to a first number of credits allocated to the first destination device and a comparison of the second credit threshold to a second number of credits allocated to the second destination device. The arbiter circuit is further configured to, in a second clock cycle select a final arbitration winner from among the pre-arbitration winner and a subsequent memory access request based on a comparison of a priority of the pre-arbitration winner and a priority of the subsequent memory access request. The arbiter circuit is further configured to drive the final arbitration winner to the data path.

A system includes a first processor package, a second processor package, and a multi-core shared memory controller (MSMC). The MSMC includes a data path. The MSMC further includes a first interface connected to the first processor package and configured to receive a first memory access request from the first processor package and a second interface connected to the second processor package and configured to receive a second memory access request from the second processor package. The MSMC further includes an arbiter circuit configured to, in a first clock cycle, determine a first destination device connected to the data path and associated with the first memory access request and a first credit threshold corresponding to the first memory access request. The arbiter circuit is further configured to, in the first clock cycle, determine a second destination device connected to the data path and associated with the second memory access request and a second credit threshold corresponding to the second memory access request. The arbiter circuit is further configured to, in the first clock cycle, select a pre-arbitration winner between the first memory access request and the second memory access request based on a comparison of the first credit threshold to a first number of credits allocated to the first destination device and a comparison of the second credit threshold to a second number of credits allocated to the second destination device. The arbiter circuit is further configured to in a second clock cycle, select a final arbitration winner from among the pre-arbitration winner and a subsequent memory access request based on a comparison of a priority of the pre-arbitration winner and a priority of the subsequent memory access request and drive the final arbitration winner to the data path.

A method includes receiving, at an arbitration circuit, a first memory access request from a first processor package connected to a first interface. The method further includes receiving, at the arbitration circuit, a second memory access request from a second processor package connected to a second interface. The method further includes, in a first clock cycle, determining, at the arbitration circuit, a first destination device associated with the first memory access request and a first credit threshold corresponding to the first memory access request. The method further includes, in the first clock cycle, determining, at the arbitration circuit, a second destination device associated with the second memory access request and a second credit threshold corresponding to the second memory access request. The method further includes, in the first clock cycle, selecting a pre-arbitration winner between the first memory access request and the second memory access request based on a comparison of the first credit threshold to a first number of credits allocated to the first destination device and a comparison of the second credit threshold to a second number of credits allocated to the second destination device. The method further includes, in a second clock cycle, selecting a final arbitration winner from among the pre-arbitration winner and a subsequent memory access request based on a comparison of a priority of the pre-arbitration winner and a priority of the subsequent memory access request and driving the final arbitration winner to the data path.

A device includes an arbiter circuit configured to receive a first request for a resource. The first request is associated with a first credit cost. The arbiter circuit is further configured to receive a second request for the resource. The second request is associated with a second credit cost. The arbiter circuit is further configured to select the first request for the resource as an arbitration winner. The arbiter circuit is further configured to decrement a number of available credits associated with the resource by the first credit cost. The arbiter circuit is further configured to, in response to the number of available credits associated with the resource falling to a lower credit threshold, wait until the number of available credits associated with the resource reaches an upper credit threshold to select an additional arbitration winner for the resource.

A system includes a first processor package, a second processor package, an external memory device; and a multi-core shared memory controller (MSMC). The MSMC includes a first interface connected to the first processor package and a second interface connected to the second processor package. The MSMC further includes an external memory interface connected to the external memory device and an arbiter circuit configured to receive a first memory access request from the first processor package for the external memory device. The first memory access request associated with a first credit cost. The arbiter circuit is further configured to receive a second memory access request from the second processor package for the external memory device. The second memory access request associated with a second credit cost. The arbiter circuit is further configured to select the first memory access request as an arbitration winner and decrement a number of available credits associated with the external memory device by the first credit cost. The arbiter circuit is further configured to, in response to the number of available credits associated with the external memory device falling to a lower credit threshold, wait until the number of available credits associated with the external memory device reaches an upper credit threshold to select an additional arbitration winner for the external memory device.

A method includes receiving a first request for a resource. The first request is associated with a first credit cost. The method further includes receiving a second request for the resource. The second request is associated with a second credit cost. The method further includes selecting the first request for the resource as an arbitration winner and decrementing a number of available credits associated with the resource by the first credit cost. The method further includes in response to the number of available credits associated with the resource falling to a lower credit threshold, waiting until the number of available credits associated with the resource reaches an upper credit threshold to select an additional arbitration winner for the resource.

BRIEF DESCRIPTION OF THE DRAWINGS

For a detailed description of various examples, reference will now be made to the accompanying drawings in which:

FIG. 7 is a table illustrating conditions under which a coherency controller issues snoop requests and accesses various memory devices.

DETAILED DESCRIPTION

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC).

Figure 1:
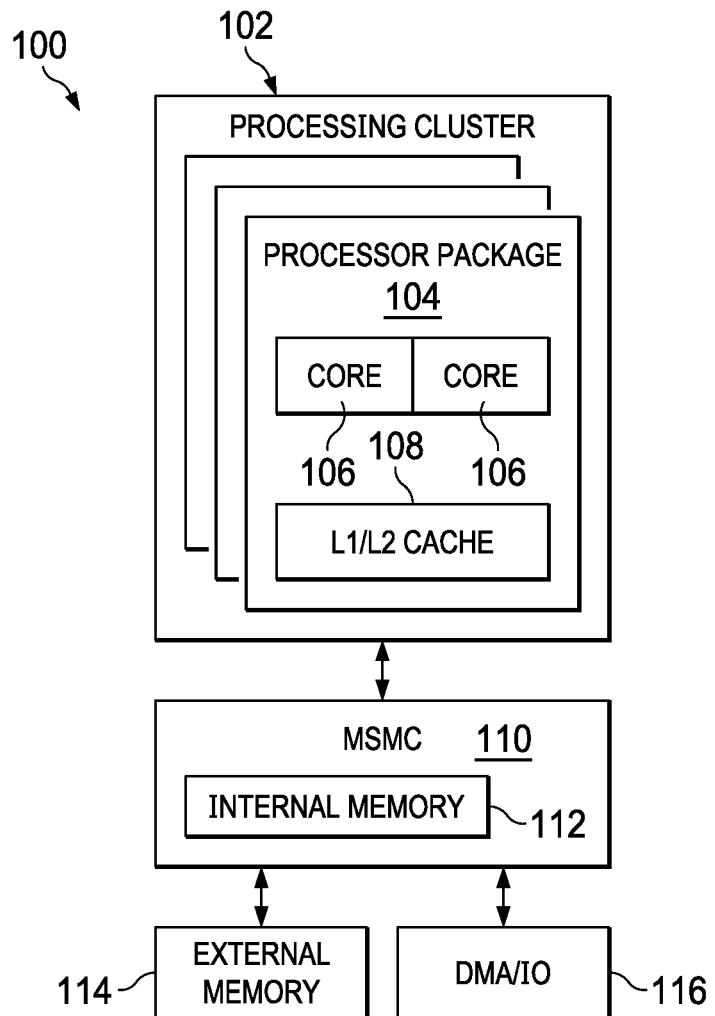
FIG. 1 illustrates a multi-core processing system, in accordance with aspects of the present disclosure.

FIG. 1 is a functional block diagram of a multi-core processing system 100, in accordance with aspects of the present disclosure. System 100 is a multi-core SoC that includes a processing cluster 102 including one or more processor packages 104. The one or more processor packages 104 may include one or more types of processors, such as a central processor unit (CPU), graphics processor unit (GPU), digital signal processor (DSP), etc. As an example, a processing cluster 102 may include a set of processor packages split between DSP, CPU, and GPU processor packages. Each processor package 104 may include one or more processing cores. As used herein, the term "core" refers to a processing module that may contain an instruction processor, such as a DSP or other type of microprocessor. Each processor package also contains one or more caches 108. These caches 108 may include one or more level one (L1) caches, and one or more level two (L2) cache. For example, a processor package 104 may include four cores, each core including an L1 data cache and L1 instruction cache, along with a L2 cache shared by the four cores.

The multi-core processing system 100 also includes a multi-core shared memory controller (MSMC) 110, through which is connected one or more external memories 114 and direct memory access/input/output (DMA/IO) clients 116. The MSMC 110 also includes an on-chip internal memory 112 system which is directly managed by the MSMC 110. In certain embodiments, the MSMC 110 helps manage traffic between multiple processor cores, other mastering peripherals or direct memory access (DMA) and allows processor packages 104 to dynamically share the internal and external memories for both program instructions and data. The MSMC internal memory 112 offers flexibility to programmers by allowing portions to be configured as shared level-2 (SL2) random access memory (RAM) or shared level-3 (SL3) RAM. External memory 114 may be connected through the MSMC 110 along with the internal shared memory 112 via a memory interface (not shown), rather than to chip system interconnect as has traditionally been done on embedded processor architectures, providing a fast path for software execution. In this embodiment, external memory may be treated as SL3 memory and therefore cacheable in L1 and L2 (e.g., the caches 108).

Figure 2:
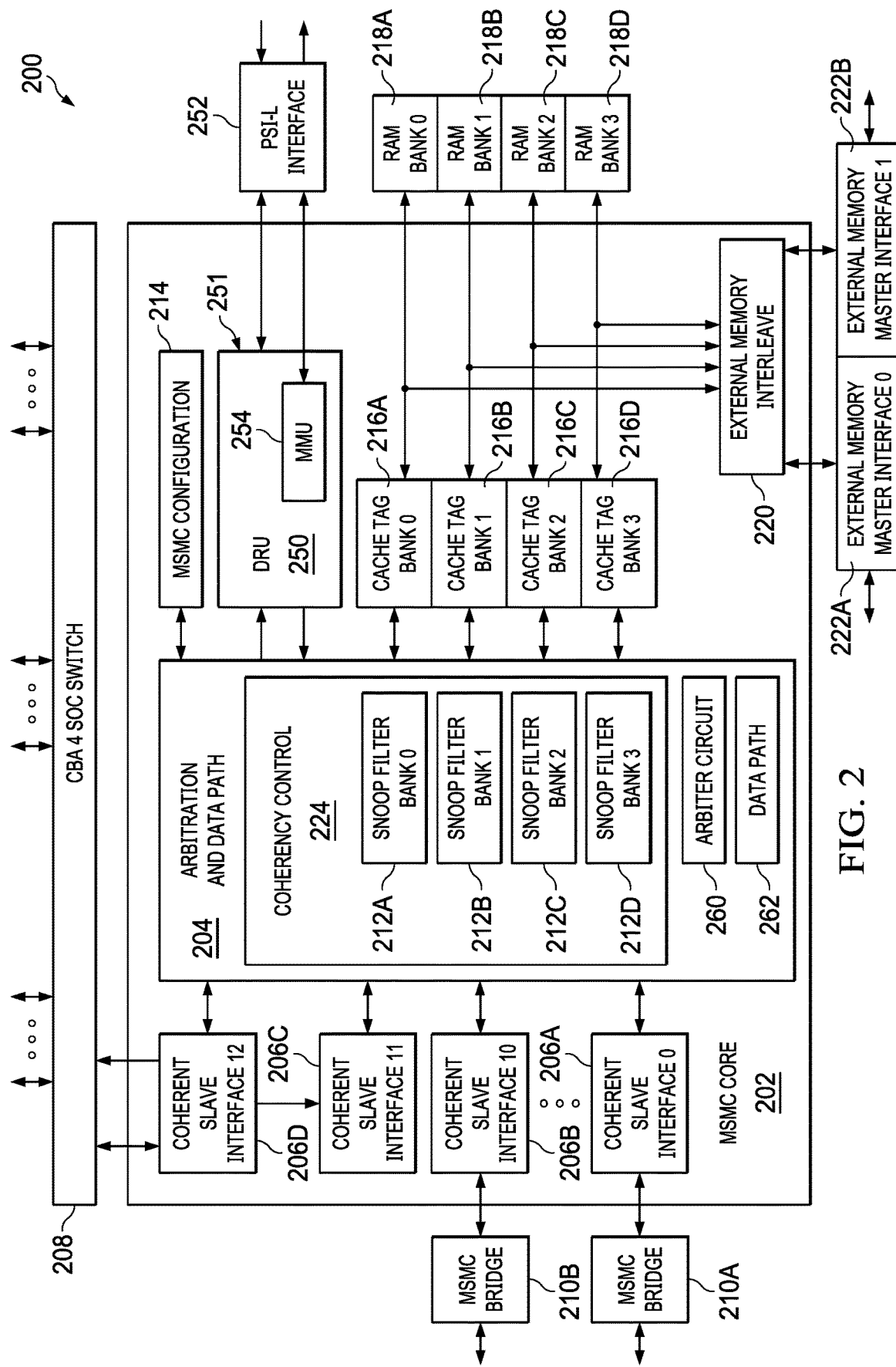
FIG. 2 is a functional block diagram of a MSMC, in accordance with aspects of the present disclosure.

FIG. 2 is a functional block diagram of a MSMC 200, in accordance with aspects of the present disclosure. The MSMC 200 may correspond to the MSMC 110 of FIG. 1.

The MSMC 200 includes a MSMC core 202 defining the primary logic circuits of the MSMC. The MSMC 200 is configured to provide an interconnect between master peripherals (e.g., devices that access memory, such as processors, direct memory access/input output devices, etc.) and slave peripherals (e.g., memory devices, such as double data rate random access memory, other types of random access memory, direct memory access/input output devices, etc.). Master peripherals connected to the MSMC 200 may include, for example, the processor packages 104 of FIG. 1. The master peripherals may or may not include caches. The MSMC 200 is configured to provide hardware based memory coherency between master peripherals connected to the MSMC 200 even in cases in which the master peripherals include their own caches. The MSMC 200 may further provide a coherent level 3 cache accessible to the master peripherals and/or additional memory space (e.g., scratch pad memory) accessible to the master peripherals.

The MSMC core 202 includes a plurality of coherent slave interfaces 206A-D. While in the illustrated example, the MSMC core 202 includes thirteen coherent slave interfaces 206 (only four are shown for conciseness), other implementations of the MSMC core 202 may include a different number of coherent slave interfaces 206. Each of the coherent slave interfaces 206A-D is configured to connect to one or more corresponding master peripherals (e.g., one of the processor packages 104 of FIG. 1.). Example master peripherals include a processor, a processor package, a direct memory access device, an input/output device, etc. Each of the coherent slave interfaces 206 is configured to transmit data and instructions between the corresponding master peripheral and the MSMC core 202. For example, the first coherent slave interface 206A may receive a read request from a master peripheral connected to the first coherent slave interface 206A and relay the read request to other components of the MSMC core 202. Further, the first coherent slave interface 206A may transmit a response to the read request from the MSMC core 202 to the master peripheral. In some implementations, the coherent slave interfaces 206 correspond to 512 bit or 256 bit interfaces and support 48 bit physical addressing of memory locations.

In the illustrated example, a thirteenth coherent slave interface 206D is connected to a common bus architecture (CBA) system on chip (SOC) switch 208. The CBA SOC switch 208 may be connected to a plurality of master peripherals and be configured to provide a switched connection between the plurality of master peripherals and the MSMC core 202. While not illustrated, additional ones of the coherent slave interfaces 206 may be connected to a corresponding CBA. Alternatively, in some implementations, none of the coherent slave interfaces 206 is connected to a CBA SOC switch.

In some implementations, one or more of the coherent slave interfaces 206 interfaces with the corresponding master peripheral through a MSMC bridge 210 configured to provide one or more translation services between the master peripheral connected to the MSMC bridge 210 and the MSMC core 202. For example, ARM v7 and v8 devices utilizing the AXI/ACE and/or the Skyros protocols may be connected to the MSMC 200, while the MSMC core 202 may be configured to operate according to a coherence streaming credit-based protocol, such as Multi-core bus architecture (MBA). The MSMC bridge 210 helps convert between the various protocols, to provide bus width conversion, clock conversion, voltage conversion, or a combination thereof. In addition, or in the alternative to such translation services, the MSMC bridge 210 may provide cache prewarming support via an Accelerator Coherency Port (ACP) interface for accessing a cache memory of a coupled master peripheral and data error correcting code (ECC) detection and generation. In the illustrated example, the first coherent slave interface 206A is connected to a first MSMC bridge 210A and an eleventh coherent slave interface 206B is connected to a second MSMC bridge 210B. In other examples, more or fewer (e.g., 0) of the coherent slave interfaces 206 are connected to a corresponding MSMC bridge.

The MSMC core 202 includes an arbitration and data path manager 204. The arbitration and data path manager 204 includes a data path 262 (e.g., an interconnect), such as a collection of wires, traces, other conductive elements, etc., between the coherent slave interfaces 206 and other components of the MSMC core 202. For example, the data path 262 may correspond to a bus. Each of the components of the MSMC core 202 is configured to communicate over the data path 262 (e.g., over the same physical connections). The arbitration and data path manager 204 includes an arbiter circuit 260 that includes logic configured to establish virtual channels between components of the MSMC 200 over the shared data path 262. In addition, the arbiter circuit 260 is configured to arbitrate access to these virtual channels over the shared data path 262 (e.g., the shared physical connections). Using virtual channels over the shared data path 262 within the MSMC 200 may reduce a number of connections and an amount of wiring used within the MSMC 200 as compared to implementations that rely on a crossbar switch for connectivity between components. In some implementations, the arbitration and data path manager 204 includes hardware logic configured to perform the arbitration operations described herein. In alternative examples, the arbitration and data path manager 204 includes a processing device configured to execute instructions (e.g., stored in a memory of the arbitration and data path manager 204) to perform the arbitration operations described herein. As described further herein, additional components of the MSMC 200 may include arbitration logic (e.g., hardware configured to perform arbitration operations, a processor configure to execute arbitration instructions, or a combination thereof). The arbitration and data path manager 204 may select an arbitration winner to place on the shared physical connections from among a plurality of requests (e.g., read requests, write requests, snoop requests, etc.) based on a priority level associated with a requestor, based on a fair-share or round robin fairness level, based on a starvation indicator, or a combination thereof.

The arbitration and data path manager 204 further includes a coherency controller 224. The coherency controller 224 includes snoop filter banks 212. The snoop filter banks 212 are hardware units that store information indicating which (if any) of the master peripherals stores data associated with lines of memory of memory devices connected to the MSMC 200. The coherency controller 224 is configured to maintain coherency of shared memory based on contents of the snoop filter banks 212.

The MSMC 200 further includes a MSMC configuration module 214 connected to the arbitration and data path manager 204. The MSMC configuration module 214 stores various configuration settings associated with the MSMC 200. In some implementations, the MSMC configuration module 214 includes additional arbitration logic (e.g., hardware arbitration logic, a processor configured to execute software arbitration logic, or a combination thereof).

The MSMC 200 further includes a plurality of cache tag banks 216. In the illustrated example, the MSMC 200 includes four cache tag banks 216A-D. In other implementations, the MSMC 200 includes a different number of cache tag banks 216 (e.g., 1 or more). In a particular example, the MSMC 200 includes eight cache tag banks 216. The cache tag banks 216 are connected to the arbitration and data path manager 204. Each of the cache tag banks 216 is configured to store "tags" indicating memory locations in memory devices connected to the MSMC 200. Each entry in the snoop filter banks 212 corresponds to a corresponding one of the tags in the cache tag banks 216. Thus, each entry in the snoop filter indicates whether data associated with a particular memory location is stored in one of the master peripherals.

Each of the cache tag banks 216 is connected to a corresponding RAM bank 218 and to a corresponding snoop filter bank 212. For example, a first cache tag bank 216A is connected to a first RAM bank 218A and to a first snoop filter bank 212A, etc. Each entry in the RAM banks 218 is associated with a corresponding entry in the cache tag banks 216 and a corresponding entry in the snoop filter banks 212. The RAM banks 218 may correspond to the internal memory 112 of FIG. 1. Entries in the RAM banks 218 may be used as an additional cache or as additional memory space based on a setting stored in the MSMC configuration module 214. The cache tag banks 216 and the RAM banks 218 may correspond to RAM modules (e.g., static RAM). While not illustrated in FIG. 2, the MSMC 200 may include read modify write queues connected to each of the RAM banks 218. These read modify write queues may include arbitration logic, buffers, or a combination thereof. Each snoop filter bank 212-cache tag bank 216-RAM bank 218 grouping may receive input and generate output in parallel.

The MSMC 200 further includes an external memory interleave 220 connected to the cache tag banks 216 and the RAM banks 218. One or more external memory master interfaces 222 are connected to the external memory interleave 220. The external memory master interfaces 222 are configured to connect to external memory devices (e.g., double data rate devices, DMA/IO devices, etc.) and to exchange messages between the external memory devices and the MSMC 200. The external memory devices may include, for example, the external memories 114 of FIG. 1, the DMA/IO clients 116, of FIG. 1, or a combination thereof. The external memory interleave 220 is configured to interleave or separate address spaces assigned to the external memory master interfaces 222. While two external memory master interfaces 222A-B are shown, other implementations of the MSMC 200 may include a different number of external memory master interfaces 222. In some implementations, the external memory master interfaces 222 support 48-bit physical addressing for connected memory devices.

The MSMC 200 also includes a data routing unit (DRU) 250, which helps provide integrated address translation and cache prewarming functionality and is coupled to a packet streaming interface link (PSI-L) interface 252, which is a system wide bus supporting DMA control messaging. The DRU 250 includes a memory management unit (MMU) 254. The MMU 254 is configured to translation between virtual and physical addresses. The MMU 254 may store translations between the virtual addresses and the physical addresses in a translation lookaside buffer, a micro translation lookaside buffer, or some other device within the MMU 254.

DMA control messaging may be used by applications to perform memory operations, such as copy or fill operations, in an attempt to reduce the latency time needed to access that memory. Additionally, DMA control messaging may be used to offload memory management tasks from a processor. However, traditional DMA controls have been limited to using physical addresses rather than virtual memory addresses. Virtualized memory allows applications to access memory using a set of virtual memory addresses without having to have any knowledge of the physical memory addresses. An abstraction layer handles translating between the virtual memory addresses and physical addresses. Typically, this abstraction layer is accessed by application software via a supervisor privileged space. For example, an application having a virtual address for a memory location and seeking to send a DMA control message may first make a request into a privileged process, such as an operating system kernel requesting a translation between the virtual address to a physical address prior to sending the DMA control message. In cases where the memory operation crosses memory pages, the application may have to make separate translation requests for each memory page. Additionally, when a task first starts, memory caches for a processor may be "cold" as no data has yet been accessed from memory and these caches have not yet been filled. The costs for the initial memory fill and abstraction layer translations can bottleneck certain tasks, such as small to medium sized tasks which access large amounts of memory. Improvements to DMA control message operations may help improve these bottlenecks.

In operation, the MSMC 200 receives a memory access request (e.g., read request, write request, etc.) from a master peripheral connected to the coherent slave interfaces 206. The memory access request indicates a memory address, which may be a virtual memory address or physical memory address within an external memory device connected to the external memory master interfaces 222 or within of one of the RAM banks 218. The memory access request is received by the arbitration and data path manager 204. The coherency controller may transmit a virtual memory address to the MMU 254 to obtain a physical memory address translation. Accordingly, the MSMC 200 may provide for coherency between master peripherals utilizing different virtual address spaces to access shared memory. Once the coherency controller 224 obtains a physical memory address, the coherency controller determines a tag associated with the physical memory address (e.g., by masking out one or more least significant bits of the physical memory addresses). The coherency controller 224 determines whether the cache provided by the RAM banks 218 stores a value for the tag and whether the master peripherals store a cached value for the tag by applying the tag to the cache tag banks 216 and checking output of the corresponding RAM banks 218 and snoop filter banks 212. Based on a type of the memory access request, a snoop state associated with the tag output by the snoop filter banks 212, and a cache status associated with the tag within the RAM banks 218, the coherency controller determines whether to issue snoop requests to one or more of the master peripherals connected to the coherent slave interfaces and whether to utilize a cached value and/or to directly access the physical address to respond to memory access request as described further herein.

The coherency controller 224 enforces memory access coherency by sequencing accesses to a particular physical address based on time of receipt and by ensuring that a most up-to-date value for the physical address is used to respond to a memory access request even in instances in which the most up-to-date value is stored in a cache of one of the master peripherals connected to the coherent slave interfaces 206. Because snoop filter banks 212 and RAM banks 218 share common cache tag banks 216, the MSMC 200 may provide caching and coherency functionality and a shared cache functionality using fewer components and utilizing a smaller footprint as compared to a device that utilizes separate cache tag banks for RAM banks and snoop filter banks. Further, the coherency controller 224, snoop filter banks 212, cache tag banks 216, and RAM banks 218 are used to enforce coherency of accesses to both external memories connected to the external memory master interfaces 222 and to the RAM banks 218. For this additional reason, the MSMC 200 may utilize fewer components and have a smaller footprint as compared to another device. In addition, because the snoop filter banks 212 are implemented in hardware rather than software, the coherency controller 224 may utilize fewer clock cycles to provide coherency as compared to software based implementations.

Figure 3:
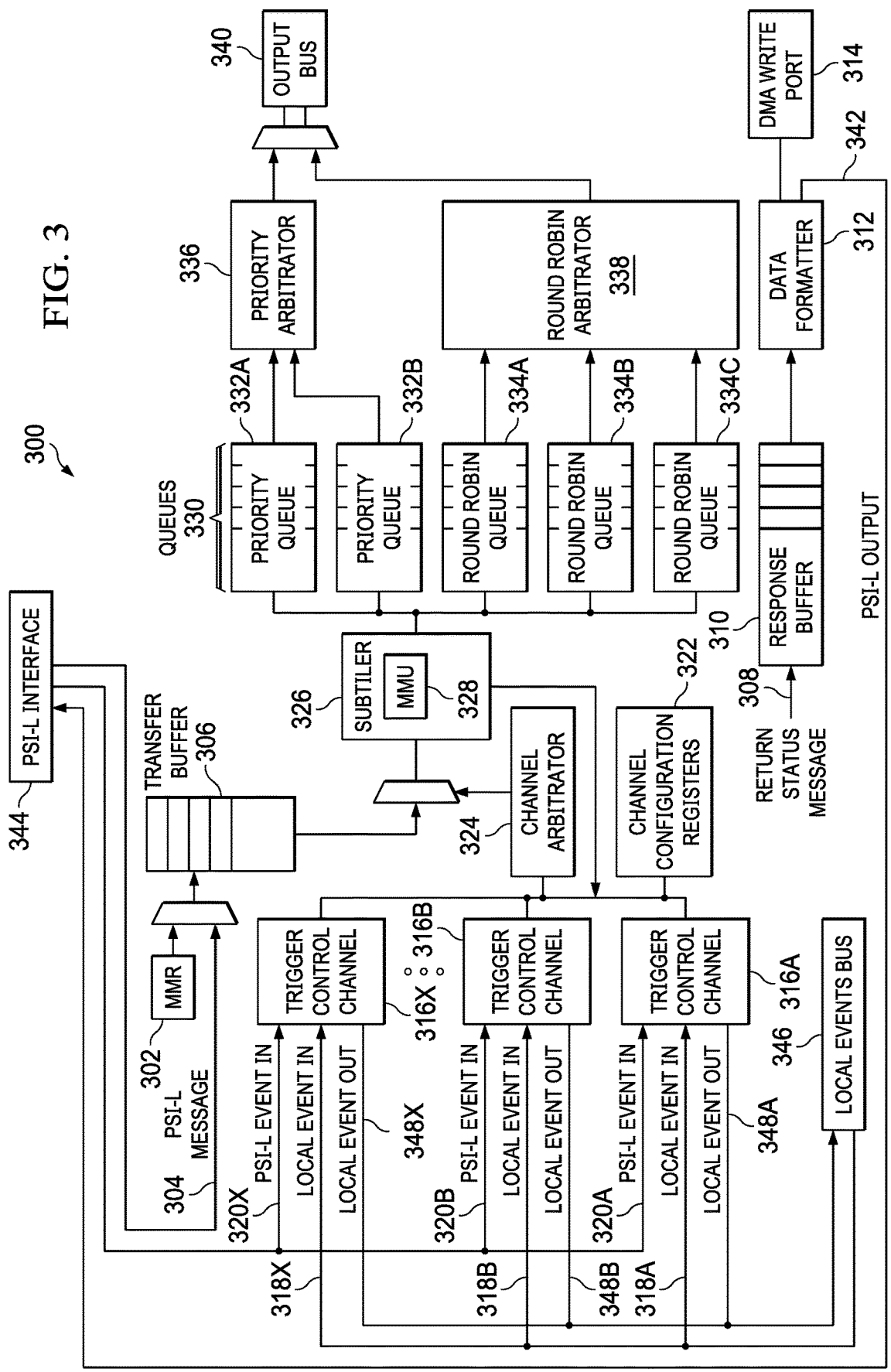
FIG. 3 is a block diagram of a DRU, in accordance with aspects of the present disclosure.

FIG. 3 is a block diagram of a DRU 300, in accordance with aspects of the present disclosure. In some implementations, the DRU 300 corresponds to the DRU 250 of FIG. 2. The DRU 300 can operate on two general memory access commands, a transfer request (TR) command to move data from a source location to a destination location, and a cache request (CR) command to send messages to a specified cache controller or memory management units (MMUs) to prepare the cache for future operations by loading data into memory caches which are operationally closer to the processor cores, such as a L1 or L2 cache, as compared to main memory or another cache that may be organizationally separated from the processor cores. The DRU 300 may receive these commands via one or more interfaces. In this example, two interfaces are provided, a direct write of a memory mapped register (MMR) 302 and via a PSI-L message 304 via a PSI-L interface 344 to a PSI-L bus. In certain cases, the memory access command and the interface used to provide the memory access command may indicate the memory access command type, which may be used to determine how a response to the memory access command is provided.

The PSI-L bus may be a system bus that provides for DMA access and events across the multi-core processing system, as well as for connected peripherals outside of the multi-core processing system, such as power management controllers, security controllers, etc. The PSI-L interface 344 connects the DRU 300 with the PSI-L bus of the processing system. In certain cases, the PSI-L may carry messages and events. PSI-L messages may be directed from one component of the processing system to another, for example from an entity, such as an application, peripheral, processor, etc., to the DRU. In certain cases, sent PSI-L messages receive a response. PSI-L events may be placed on and distributed by the PSI-L bus by one or more components of the processing system. One or more other components on the PSI-L bus may be configured to receive the event and act on the event. In certain cases, PSI-L events do not require a response.

The PSI-L message 304 may include a TR command. The PSI-L message 304 may be received by the DRU 300 and checked for validity. If the TR command fails a validity check, a channel ownership check, or transfer buffer 306 fullness check, a TR error response may be sent back by placing a return status message 308, including the error message, in the response buffer 310. If the TR command is accepted, then an acknowledgement may be sent in the return status message. In certain cases, the response buffer 310 may be a first in, first out (FIFO) buffer. The return status message 308 may be formatted as a PSI-L message by the data formatter 312 and the resulting PSI-L message 342 sent, via the PSI-L interface 344, to a requesting entity which sent the TR command.

A relatively low-overhead way of submitting a TR command, as compared to submitting a TR command via a PSI-L message, may also be provided using the MMR 302. According to certain aspects, a core of the multi-core system may submit a TR request by writing the TR request to the MMR circuit 302. The MMR may be a register of the DRU 300. In certain cases, the MSMC may include a set of registers and/or memory ranges which may be associated with the DRU 300, such as one or more registers in the MSMC configuration module 214. When an entity writes data to this associated memory range, the data is copied to the MMR 302 and passed into the transfer buffer 306. The transfer buffer 306 may be a FIFO buffer into which TR commands may be queued for execution. In certain cases, the TR request may apply to any memory accessible to the DRU 300, allowing the core to perform cache maintenance operations across the multi-core system, including for other cores.

The MMR 302, in certain embodiments, may include two sets of registers, an atomic submission register and a non-atomic submission register. The atomic submission register accepts a single 64 byte TR command, checks the values of the burst are valid values, pushes the TR command into the transfer buffer 306 for processing, and writes a return status message 308 for the TR command to the response buffer 310 for output as a PSI-L event. In certain cases, the MMR 302 may be used to submit TR commands but may not support messaging the results of the TR command and an indication of the result of the TR command submitted by the MMR 302 may be output as a PSI-L event, as discussed above.

The non-atomic submission register provides a set of register fields (e.g., bits or designated set of bits) which may be written into over multiple cycles rather than in a single burst. When one or more fields of the register, such as a type field, is set, the contents of the non-atomic submission register may be checked and pushed into the transfer buffer 306 for processing and an indication of the result of the TR command submitted by the MMR 302 may be output as a PSI-L event, as discussed above.

Commands for the DRU may also be issued based on one or more events received at one or more trigger control channels 316A-316X. In certain cases, multiple trigger control channels 316A-316X may be used in parallel on common hardware and the trigger control channels 316A-316X may be independently triggered by received local events 318A-318X and/or PSI-L global events 320A-320X. In certain cases, local events 318A-318X may be events sent from within a local subsystem controlled by the DRU and local events may be triggered by setting one or more bits in a local events bus 346. PSI-L global events 320A-320X may be triggered via a PSI-L event received via the PSI-L interface 344. When a trigger control channel is triggered, local events 348A-348X may be output to the local events bus 346.

Each trigger control channel may be configured, prior to use, to be responsive to (e.g., triggered by) a particular event, either a particular local event or a particular PSI-L global event. In certain cases, the trigger control channels 316A-316X may be controlled in multiple parts, for example, via a non-realtime configuration, intended to be controlled by a single master, and a realtime configuration controlled by a software process that owns the trigger control channel. Control of the trigger control channels 316A-316X may be set up via one or more received channel configuration commands.

Non-realtime configuration may be performed, for example, by a single master, such as a privileged process, such as a kernel application. The single master may receive a request to configure a trigger control channel from an entity. The single master then initiates a non-realtime configuration via MMR writes to particular region of channel configuration registers 322, where regions of the channel configuration registers 322 correlate to a particular trigger control channel being configured. The configuration includes fields which allow the particular trigger control channel to be assigned, an interface to use to obtain the TR command, such as via the MMR 302 or PSI-L message 304, which queue of one or more queues 330 a triggered TR command should be sent to, and one or more events to output on the PSI-L bus after the TR command is triggered. The trigger control channel being configured then obtains the TR command from the assigned interface and stores the TR command. In certain cases, the TR command includes triggering information. The triggering information indicates to the trigger control channel what events the trigger control is responsive to (e.g. triggering events). These events may be particular local events internal to the memory controller or global events received via the PSI-L interface 344. Once the non-realtime configuration is performed for the particular channel, a realtime configuration register of the channel configuration registers 322 may be written by the single master to enable the trigger control channel. In certain cases, a trigger control channel can be configured with one or more triggers. The triggers can be a local event, or a PSI-L global event. Realtime configuration may also be used to pause or teardown the trigger control channel.

Once a trigger control channel is activated, the channel waits until the appropriate trigger is received. For example, a peripheral may configure a particular trigger control channel, in this example trigger control channel 316B, to respond to PSI-L events and, after activation of the trigger control channel 316B, the peripheral may send a triggering PSI-L event 320B to the trigger control channel 316B. Once triggered, the TR command is sent by the trigger control channels 316A-316X. The sent TR commands are arbitrated by the channel arbitrator 324 for translation by the subtiler 326 into an op code operation addressed to the appropriate memory. In certain cases, the arbitration is based on a fixed priority associated with the channel and a round robin queue arbitration may be used for queue arbitration to determine the winning active trigger control channel. In certain cases, a particular trigger control channel, such as trigger control channel 316B, may be configured to send a request for a single op code operation and the trigger control channel cannot send another request until the previous request has been processed by the subtiler 326.

In accordance with aspects of the present disclosure, the subtiler 326 includes a memory management unit (MMU) 328. In some implementations, the MMU 328 corresponds to the MMU 254 of FIG. 2. The MMU 328 helps translate virtual memory addresses to physical memory addresses for the various memories that the DRU can address, for example, using a set of page tables to map virtual page numbers to physical page numbers. In certain cases, the MMU 328 may include multiple fully associative micro translation lookaside buffers (uTLBs) which are accessible and software manageable, along with one or more associative translation lookaside buffers (TLBs) caches for caching system page translations. In use, an entity, such as an application, peripheral, processor, etc., may be permitted to access a particular virtual address range for caching data associated with the application. The entity may then issue DMA requests, for example via TR commands, to perform actions on virtual memory addresses within the virtual address range without having to first translate the virtual memory addresses to physical memory addresses. As the entity can issue DMA requests using virtual memory addresses, the entity may be able to avoid calling a supervisor process or other abstraction layer to first translate the virtual memory addresses. Rather, virtual memory addresses in a TR command, received from the entity, are translated by the MMU to physical memory addresses. The MMU 328 may be able to translate virtual memory addresses to physical memory addresses for each memory the DRU can access, including, for example, internal and external memory of the MSMC, along with L2 caches for the processor packages.

In certain cases, the DRU can have multiple queues and perform one read or one write to a memory at a time. Arbitration of the queues may be used to determine an order in which the TR commands may be issued. The subtiler 326 takes the winning trigger control channel and generates one or more op code operations using the translated physical memory addresses, by, for example, breaking up a larger TR into a set of smaller transactions. The subtiler 326 pushes the op code operations into one or more queues 330 based, for example, on an indication in the TR command on which queue the TR command should be placed. In certain cases, the one or more queues 330 may include multiple types of queues which operate independently of each other. In this example, the one or more queues 330 include one or more priority queues 332A-332B and one or more round robin queues 334A-334C. The DRU may be configured to give priority to the one or more priority queues 332A-332B. For example, the priority queues may be configured such that priority queue 332A has a higher priority than priority queue 332B, which would in turn have a higher priority than another priority queue (not shown). The one or more priority queues 332A-332B (and any other priority queues) may all have priority over the one or more round robin queues 334A-334C. In certain cases, the TR command may specify a fixed priority value for the command associated with a particular priority queue and the subtiler 326 may place those TR commands (and associated op code operations) into the respective priority queue. Each queue may also be configured so that a number of consecutive commands that may be placed into the queue. As an example, priority queue 332A may be configured to accept four consecutive commands. If the subtiler 326 has five op code operations with fixed priority values associated with priority queue 332A, the subtiler 326 may place four of the op code operations into the priority queue 332A. The subtiler 326 may then stop issuing commands until at least one of the other TR commands is cleared from priority queue 332A. Then the subtiler 326 may place the fifth op code operation into priority queue 332A. A priority arbitrator 336 performs arbitration as to the priority queues 332A-332B based on the priority associated with the individual priority queues.

As the one or more priority queues 332A-332B have priority over the round robin queues 334A-334C, once the one or more priority queues 332A-332B are empty, the round robin queues 334A-334C are arbitrated in a round robin fashion, for example, such that each round robin queue may send a specified number of transactions through before the next round robin queue is selected to send the specified number of transactions. Thus, each time arbitration is performed by the round robin arbitrator 338 for the one or more round robin queues 334A-334C, the round robin queue below the current round robin queue will be the highest priority and the current round robin queue will be the lowest priority. If an op code operation gets placed into a priority queue, the priority queue is selected, and the current round robin queue retains the highest priority of the round robin queues. Once an op code operation is selected from the one or more queues 330, the op code operation is output via an output bus 340 to the MSMC central arbitrator (e.g., the arbitration and data path manager 204 of FIG. 2) for output to the respective memory.

In cases where the TR command is a read TR command (e.g., a TR which reads data from the memory), once the requested read is performed by the memory, the requested block of data is received in a return status message 308, which is pushed onto the response buffer 310. The response is then formatted by the data formatter 312 for output. The data formatter 312 may interface with multiple busses for outputting, based on the information to be output. For example, if the TR includes multiple loops to load data and specifies a particular loop in which to send an event associated with the TR after the second loop, the data formatter 312 may count the returns from the loops and output the event after the second loop result is received.

In certain cases, write TR commands may be performed after a previous read command has been completed and a response received. If a write TR command is preceded by a read TR command, arbitration may skip the write TR command or stop if a response to the read TR command has not been received. A write TR may be broken up into multiple write op code operations and these multiple write op code operations may be output to the MSMC central arbitrator (e.g., the arbitration and data path manager 204 of FIG. 2) for transmission to the appropriate memory prior to generating a write completion message. Once all the responses to the multiple write op code operations are received, the write completion message may be output.

In addition to TR commands, the DRU may also support CR commands. In certain cases, CR commands may be a type of TR command and may be used to place data into an appropriate memory or cache closer to a core than main memory prior to the data being needed. By preloading the data, when the data is needed by the core, the core is able to find the data in the memory or cache quickly without having to request the data from, for example, main memory or persistent storage. As an example, if an entity knows that a core will soon need data that is not currently cached (e.g., data not used previously, just acquired data, etc.), the entity may issue a CR command to prewarm a cache associated with the core. This CR command may be targeted to the same core or another core. For example, the CR command may write data into a L2 cache of a processor package that is shared among the cores of the processor package.

In accordance with aspects of the present disclosure, how a CR command is passed to the target memory varies based on the memory or cache being targeted. As an example, a received CR command may target an L2 cache of a processor package. The subtiler 326 may translate the CR command to a read op code operation. The read op code operation may include an indication that the read op code operation is a prewarming operation and is passed, via the output bus 340 to the MSMC. Based on the indication that the read op code is a prewarming operation, the MSMC routes the read op code operation to the memory controller of the appropriate memory. By issuing a read op code to the memory controller, the memory controller may attempt to load the requested data into the L2 cache to fulfill the read. Once the requested data is stored in the L2 cache, the memory controller may send a return message indicating that the load was successful to the MSMC. This message may be received by the response buffer 310 and may be output at PSI-L output 342 as a PSI-L event. As another example, the subtiler 326, in conjunction with the MMU 328, may attempt to prewarm an L3 cache. The subtiler 326 may format the CR command to the L3 cache as a cache read op code and pass the cache read, via the output bus 340 and the MSMC, to the L3 cache memory itself. The L3 cache then loads the appropriate data into the L3 cache and may return a response indicating the load was successful, and this response may also include the data pulled into the L3 cache. This return message may, in certain cases, be discarded.

Figure 4:
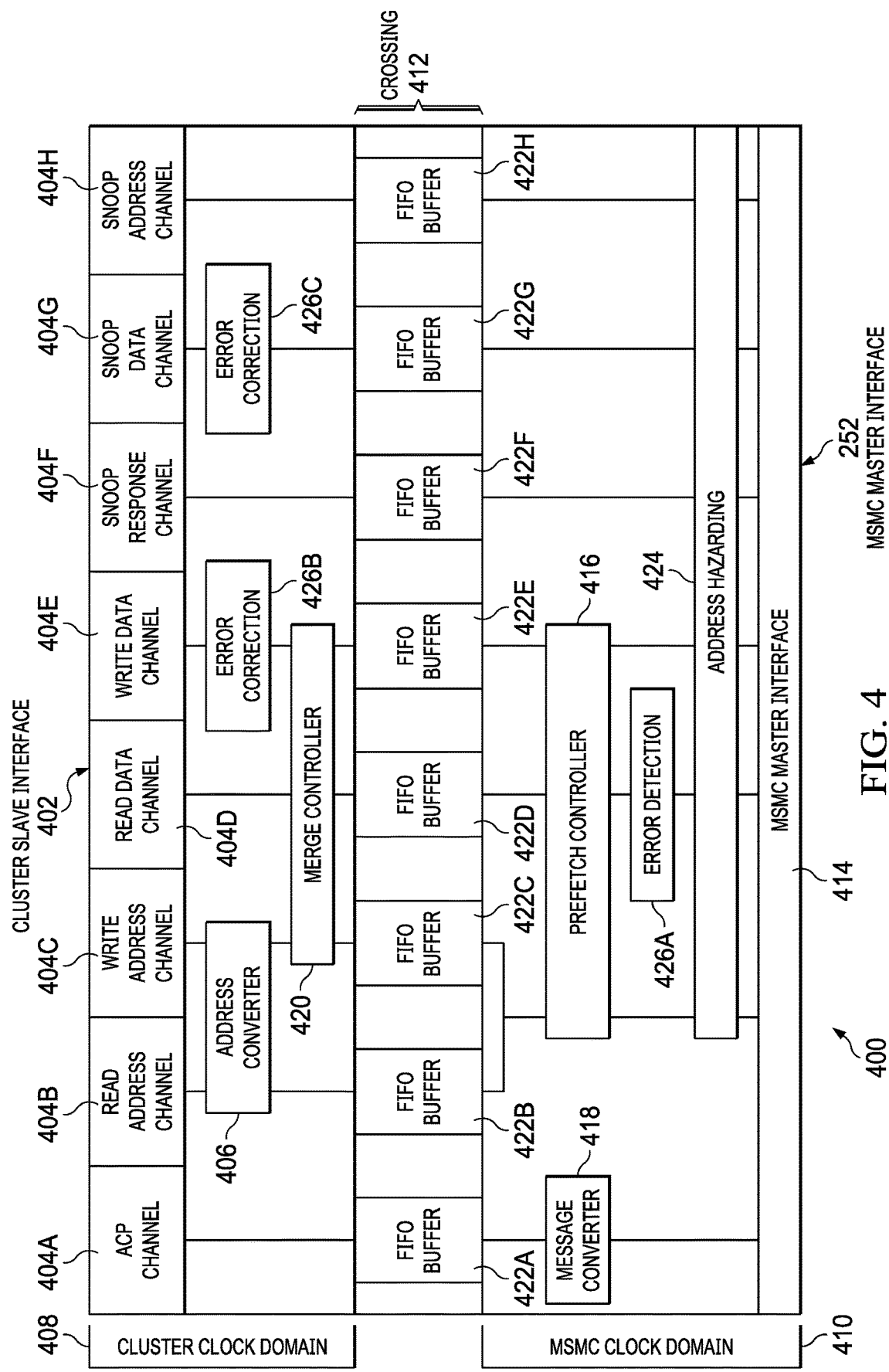
FIG. 4 is a block diagram of a MSMC bridge.

FIG. 4 is a block diagram of a MSMC bridge 400, in accordance with aspects of the present disclosure. The MSMC bridge 400 includes a cluster slave interface 402, which may be coupled to a master peripheral to provide translations services. The cluster slave interface 402 communicates with the master peripheral though a set of channels 404A-404H. In certain cases, these channels include an ACP channel 404A, read address channel 404B, write address channel 404C, read data channel 404D, write data channel 404E, snoop response channel 404F, snoop data channel 404G, and snoop address channel 404H. The cluster slave interface 402 responds to the master peripheral as a slave and provides the handshake and signal information for communication with the master peripheral as a slave device. An address converter 406 helps convert read addresses and write addresses as between address formats (e.g., formats utilizing different numbers of bits) used by the master peripheral and the MSMC. The ACP, read and write addresses as well as the read data, write data, snoop response, snoop data and snoop address pass between a cluster clock domain 408 and a MSMC clock domain 410 via crossing 412 and on to the MSMC via a MSMC master interface 414. The cluster clock domain 408 and the MSMC clock domain 410 may operate at different clock frequencies and with different power requirements.

The crossing 412 may use a level detection scheme to asynchronously transfer data between domains. In certain cases, transitioning data across multiple clock and power domains incur an amount of crossing expense in terms of a number of clock cycles, in both domains, for the data to be transferred over. Buffers may be used to store the data as they are transferred. Data being transferred are stored in asynchronous FIFO buffers 422A-422H, which include logic straddling both the cluster clock domain 408 and the MSMC clock domain 410. Each FIFO buffer 422A-422H include multiple data slots and a single valid bit line per data slot. Data being transferred between may be placed in the data slots and processed in a FIFO manner to transfer the data as between the domains. The data may be translated, for example, between the MSMC bus protocol to a protocol in use by the master peripheral while the data is being transferred over. This overlap of the protocol conversion with the domain crossing expense helps limit overall latency for domain crossing.

In certain cases, the ACP channel 404A may be used to help perform cache prewarming. The ACP channel help allow access to cache of a master peripheral. When a prefetch message is received, for example from the MRU, the prewarm message may be translated into a format appropriate for the master peripheral by a message converter 418 and sent, via the ACP channel 404A to the master peripheral. The master peripheral may then request the memory addresses identified in the prewarm message and load data from the memory addresses into the cache of the master peripheral.

In certain cases, the MSMC bridge may be configured to perform error detection and error code generation to help protect data integrity. In this example, error detection may be performed on data returned from a read request from the MSMC master interface 414 by an error detection unit 426A. Additionally, error detection and error code generation may be provided by error detection units 426B and 426C for write data and snoop data, respectively. Error detection and error code generation may be provided by any known ECC scheme.

In certain cases, the MSMC bridge 400 includes a prefetch controller 416. The prefetch controller attempts to predict, based on memory addresses being accessed, whether and which additional memory addresses may be accessed in the future. The prediction may be based on one or more heuristics, which detects and identifies patterns in memory accesses. Based on these identified patterns, the prefetch controller 416 may issue additional memory requests. For example, the prefetch controller 416 may detect a series of memory requests for set of memory blocks and identify that these requests appear to be for sequential memory blocks. The prefetch controller 416 may then issue additional memory requests for the next N set of sequential memory blocks. These additional memory requests may cause, for example, the requested data to be cached in a memory cache, such as a L2 cache, of the master peripheral or in a cache memory of the MSMC, such as the RAM banks 218 of FIG. 2.

As prefetching may introduce coherency issues where a prefetched memory block may be in use by another process, the prefetch controller 416 may detect how the requested memory addresses are being accessed, for example, whether the requested memory addresses are shared or owned and adjust how prefetching is performed accordingly. In shared memory access, multiple processes may be able to access a memory address and the data at the memory address may be changed by any process. For owned memory access, a single process exclusively has access to the memory address and only that process may change the data at the memory address. In certain cases, if the memory accesses are shared memory reads, then the prefetch controller 416 may prefetch additional memory blocks using shared memory accesses. The MSMC bridge 400 may also include an address hazarding unit 424 which tracks each outstanding read and write transaction, as well as snoop transactions sent to the master peripheral. For example, when a read request is received from the master peripheral, the address hazarding unit 424 may create a scoreboard entry to track the read request indicating that the read request is in flight. When a response to the read request is received, the scoreboard entry may be updated to indicate that the response has been received, and when the response is forwarded to the master peripheral, the scoreboard entry may be cleared. If the prefetch controller 416 detects that the memory access includes owned read or write accesses, the prefetch controller 416 may perform snooping, for example by checking with the prefetch controller 416 or the snoop filter banks 212 of FIG. 2, to determine if the memory blocks to be prefetched are otherwise in use or overlap with addresses used by other processes. In cases where a prefetched memory block is accessed by another process, for example if there are overlapping snoop requests or a snoop request for an address that is being prefetched, then the prefetch controller 416 may not issue the prefetching commands or invalidate prefetched memory blocks.

In certain cases, snoop requests may arrive from the MSMC to the MSMC bridge 400. Where a snoop request from the MSMC for a memory address overlaps with an outstanding read or write to the memory address from a master peripheral, the address hazarding unit 424 may detect the overlap and stall the snoop request until the outstanding read or write is complete. In certain cases, read or write requests may be received by the MSMC bridge for a memory address which overlaps with a snoop request that has been sent to the master peripheral. In such cases, the address hazarding unit 424 may detect such overlaps and stall the read or write requests until a response to the snoop request has been received from the master peripheral.

The address hazarding unit 424 may also help provide memory barrier support. A memory barrier instruction may be used to indicate that a set of memory operations must be completed before further operations are performed. As discussed above, the address hazarding unit 424 tracks in flight memory requests to or from a master peripheral. When a memory barrier instruction is received, the address hazarding unit may check to see whether the memory operations indicated by the memory barrier instruction have completed. Other requests may be stalled until the memory operations are completed. For example, a barrier instruction may be received after a first memory request and before a second memory request. The address hazarding unit 424 may detect the barrier instruction and stall execution of the second memory request until after a response to the first memory request is received.

The MSMC bridge 400 may also include a merge controller 420. In certain cases, the master peripheral may issue multiple write requests for multiple, sequential memory addresses. As each separate write request has a certain amount of overhead, it may be more efficient to merger a number of these sequential write requests into a single write request. The merge controller 420 is configured to detect multiple sequential write requests as they are queued into the FIFO buffers and merge two or more of the write requests into a single write request. In certain cases, responses to the multiple write requests may be returned to the master peripheral as the multiple write requests are merged and prior to sending the merged write request to the MSMC. While described in the context of a write instruction, the merge controller 420 may also be configured to merge other memory requests, such as memory read requests.

Figure 5:
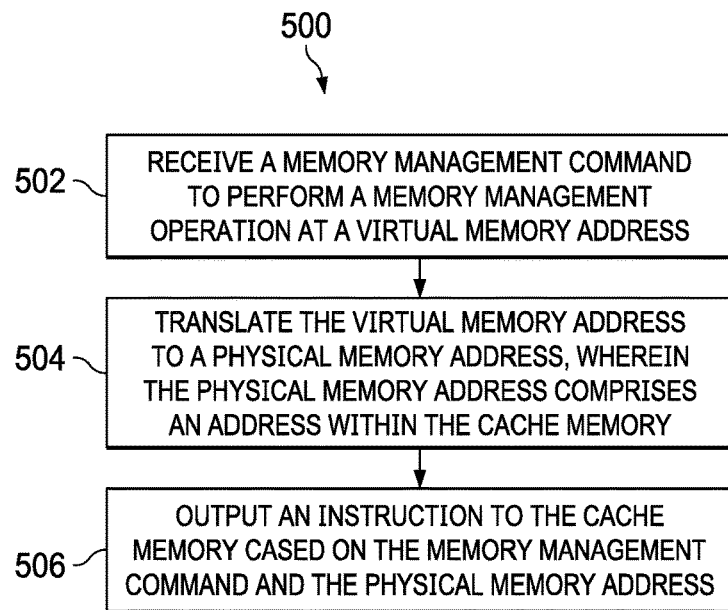
FIG. 5 is a flow diagram illustrating a technique for accessing memory by a memory controller, in accordance with aspects of the present disclosure.

FIG. 5 is a flow diagram illustrating a technique 500 for accessing memory by a memory controller, in accordance with aspects of the present disclosure. At block 502, a trigger control channel receives configuration information, the configuration information defining a first one or more triggering events. As an example, the memory controller may receive, from an entity, including a peripheral that is outside of the processing system such as a chip separate from an SoC, configuration information. The configuration information may be received via a privileged process and the configuration information may include information defining trigger events for the channel, along with an indication of an interface that may be used to obtain a memory management command.

At block 504, the trigger control channel receives a first memory management command. For example, the trigger control channel may obtain the memory management command via the indicated interface from the configuration information. At block 506, the first memory management command is stored. At block 508, the trigger control channel detects a first one or more triggering events. For example, the trigger control channel may, based on the configuration information, monitor global and local events to detect one or more particular events. When the one or more particular events are detected, the trigger control channel is triggered.

At block 510 the trigger control channel triggers the stored first memory management command based on the detected first one or more triggering events. For example, the trigger control channel transmits the first memory management command to one or more queues for arbitration against other memory management commands. After winning in arbitration, the first memory management command may then be outputted for transmission to the appropriate memory location.

Figure 6:
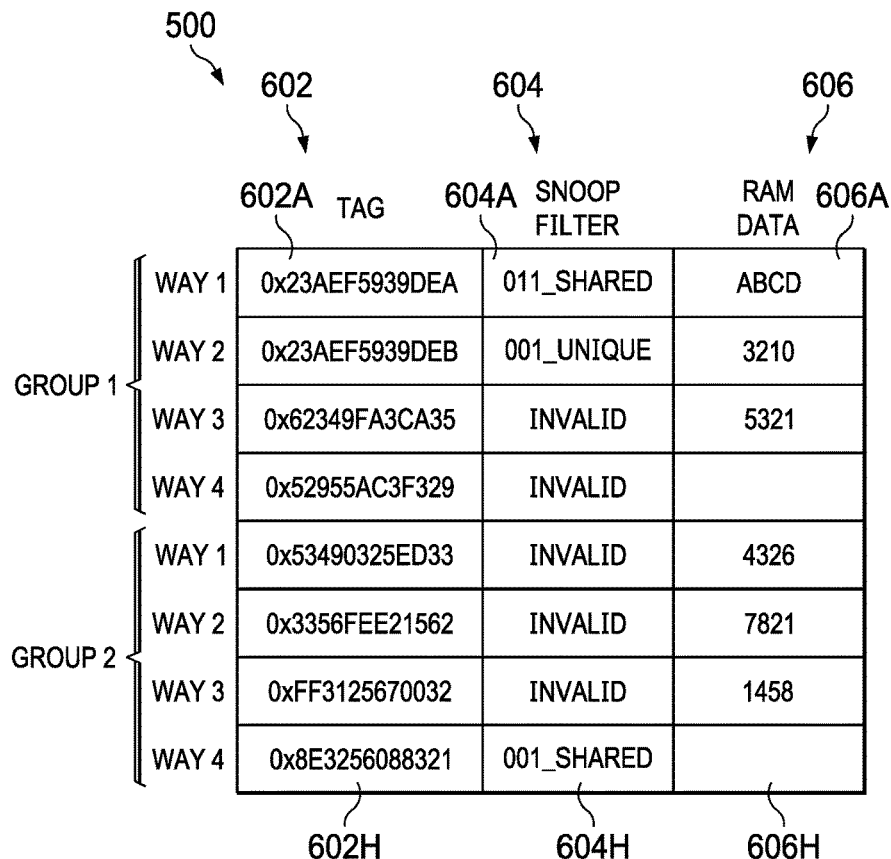
FIG. 6 is a table illustrating data stored by snoop filter banks, cache tag banks, and random access memory (RAM) banks.

Referring back to FIG. 2, the MSMC 200 is configured to provide coherent access to the RAM banks 218 and to memory connected to the external memory master interfaces for master peripherals connected to the to the coherent slave interfaces 206 using the hardware snoop filter banks 212. FIG. 6 illustrates an example table 600 of data stored by the snoop filter banks 212, the cache tag banks 216 and the RAM banks 218. In particular, the table 600 includes tag data 602 stored by the cache tag banks 216, snoop filter data 604 stored by the snoop filter banks 212, and RAM data 606 stored by the RAM banks 218. Each entry in the tag data 602 is associated with a corresponding entry in the snoop filter data 604 and a corresponding entry in the RAM data 606. Together, the data in the table 600 comprises a coherent cache in which the tag data 602 indicates memory addresses of memory devices connected to the external memory master interfaces 222, the snoop filter data 604 indicates snoop states of memory stored at the corresponding memory addresses, and the RAM data 606 stores cached values associated with the memory addresses or stores "scratch" data. A snoop state indicates whether any cache (e.g., of the master peripherals) stores data associated with a corresponding tag address and what a state of the data in that cache is. For example, the state of the data may be INVALID, CLEAN, or DIRTY. CLEAN indicates that data in the cache matches data in memory. DIRTY indicates that data in the cache has been modified and no longer matches data in memory. INVALID indicates that a value stored in the cache is not valid.

The snoop state may further identify a cache that "owns" the tag address (e.g., has permission to edit data stored in the tag address). The MSMC 200 allocates the RAM data 606 between use as cache data and scratch data based on data stored in the MSMC configuration module 214. RAM data that is allocated as scratch data is directly accessible to the master peripherals connected to the coherent slave interfaces 206 while RAM data that is allocated as cache data corresponds to a cache of data stored in memory devices connected to the external memory master interfaces 222. Accordingly, the RAM banks 218 may provide a data cache (e.g., a level 2 or level 3 data cache) between the master peripherals and the memory devices connected to the external memory master interfaces 222, scratch data storage accessible to the master peripherals, or a combination thereof.

The table 600 illustrates data stored in one of the cache tag banks 216 (e.g., the first cache tag bank 216A), one of the RAM banks 218 (e.g., the first RAM bank 218A), and the snoop filter banks 212 (e.g., the first snoop filter bank 212A). Each row of the table corresponds to a cache way line that includes elements of the snoop filter banks 212, one of the cache tag banks 216, and one of the RAM banks 218. These way lines are divided into groups. In the illustrated example, the table 600 depicts two groups of four way lines however, in some implementations, each cache tag bank/RAM bank pair includes a different number of ways per group and/or a different number of groups. Similar tables may be formed based on data stored in ways of the other RAM banks 218 and cache tag banks 216. Because each tag entry in the tag data 602 corresponds to both an entry in the snoop filter data 604 and an entry in the RAM data 606, the MSMC 200 may avoid storing separate tag data structures for the snoop filter data 604 and the RAM data 606. Accordingly, the MSMC 200 may require fewer cache tag databanks as compared to implementations in which the snoop filter data 604 and the RAM data 606 are independently mapped to tag data.

The coherency controller 224 is configured to ensure that the master peripherals have a coherent view of data stored in memory devices connected to the external memory master interfaces 222 even in implementations in which the master peripherals maintain their own caches. The coherency controller 224 supports various states for data stored in the caches. These states include "modified," "owned," "exclusive," "shared," and "invalid." "Modified" indicates that only one cache of a master peripheral has data corresponding to a tag address and that data associated with the tag address is "dirty." Dirty means that a cached value of data may be different from a value of the data stored in memory. "Owned" indicates that multiple caches have data corresponding to a tag address and that the data is dirty (e.g., one of the caches may store a modified version of the data). "Exclusive" indicates that only one cache of a master peripheral has data corresponding to a tag address and that the data is "clean." Clean means that the data stored in the cache matches data stored in memory. "Shared" indicates that the data is located in multiple caches and is clean. "Invalid" indicates that no cache stores data associated with a tag address. The snoop filter data 604 includes snoop state data that the coherency controller 224 uses to support the data states described above.

Examples of snoop filter states that may be indicated by the snoop filter data 604 include "INVALID," "CPU*_SHARED," "CPU*_UNIQUE," "BROADCAST_SHARED," and "BROADCAST_UNIQUE." The "INVALID" state indicates that a memory block is in an invalid state (or absent) from all caches of the master peripheral devices. The CPU*_SHARED state includes an identifier of a master peripheral and indicates that data associated with the state is stored in a cache of that master peripheral in the shared state or the owned state. The CPU*_Unique state includes an identifier of a master peripheral and indicates that data associated with the state is stored in a cache of that master peripheral in the shared state, the owned state, the exclusive state, or the modified state. The BROADCAST_SHARED state indicates that data associated with the state is stored in caches of more than one master peripheral in the shared state or the owned state. The BROADCAST_UNIQUE state indicates that data associated with the state is stored in caches of more than one master peripheral in the owned state, the exclusive state, or the modified state. The CPU*_SHARED and CPU*_UNIQUE states may include the identifier of the master peripheral encoded as a saturating vector. For example, these states may be indicated by a sequence of bits in which a portion of the bits corresponds to a saturating vector identifying a master peripheral and a second portion indicates whether the state is SHARED or UNIQUE. The saturating vector indicates an identifier, CPU*, of one master peripheral that caches a data value rather than identifying each master peripheral that caches the data value. Accordingly, a number of bit lines used for the snoop filter banks 212 scales linearly with a number of master peripherals (or master peripherals that include a cache).

In the illustrated example, a first entry 602A of the tag data 602 shown in FIG. 6 corresponds to a first entry 604A of the snoop filter data 604 and to a first entry 606A of the RAM data 606. The first entry 602A of the tag data 602, the first entry 604A of the snoop filter data 604, and the first entry 606A of the RAM data 606 are stored on a first way of a first group of ways. This first way corresponds to a cache line that is included across the snoop filter banks 212, one of the cache tag banks 216, and one of the RAM banks 218. In the illustrated example, the first entry 602A of the tag data 602 identifies a memory address 0x23AEF5939DEA, the first entry 604A of the snoop filter data stores a state of 011_SHARED, and the first entry 606A of the RAM data 606 stores a value of ABCD. Accordingly, FIG. 6 indicates that a cache of a master peripheral 011 stores a value associated with memory address 0x23AEF5939DEA in the shared state or the owned state and that the RAM banks 218 store a value ABCD associated with the memory address 0x23AEF5939DEA.

Further, an eighth entry 602H of the tag data 602 shown in FIG. 6 corresponds to an eighth entry 604H of the snoop filter data 604 and to an eighth entry 606H of the RAM data 606 shown in FIG. 6. The eighth entry 602H of the tag data 602, the eighth entry 604H of the snoop filter data 604, and the eighth entry 606H of the RAM data 606 are stored on a fourth way of a second group of ways. In the illustrated example, the eighth entry 602H of the tag data 602 identifies a memory address 0x8E3256088321, the eighth entry 604H of the snoop filter data stores a state of 001_SHARED, and the eighth entry 606H of the RAM data 606 indicates that the RAM banks 218 do not store a value for the memory address 0x8E3256088321. Accordingly, FIG. 6 indicates that a cache of a master peripheral 001 stores a value associated with memory address 0x8E3256088321 in the shared state or the owned state and that the RAM banks 218 do not store a value for the memory address 0x8E3256088321. It should be noted that while the table 600 illustrates the eighth entry 606H of the RAM data 606 as blank, a cache line in the RAM banks 218 corresponding to the fourth way of the second group may include data. However, a flag (or other indicator) in the RAM banks 218 may indicate that the data stored in the fourth way of the second group is invalid or the fourth way of the RAM bank may be allocated to scratch pad memory rather than to cache space.

FIG. 7 is a table 700 illustrating under what conditions the coherency controller 224 issues snoop requests to the master peripherals and under what conditions the coherency controller 224 uses cached data to respond to a memory access request (e.g., a read or write) from the master peripherals for the INVALID state, the CPU*_SHARED state, and the CPU*_UNIQUE state.

A first row 702 of the table 700 illustrates that, in response to receiving a read request for a memory address corresponding to a tag that is cached in the RAM banks 218 (e.g., L3 cache data hit) and for which the snoop filter data 604 indicates the snoop state is INVALID, the coherency controller 224 is configured to return a value of the tag from the RAM banks 218 without performing a snoop of the master peripherals. A memory address corresponds to a tag "corresponds" to a tag if the memory address is within a range [tag, tag+maximum offset]. The maximum offset may be positive or negative and may be based on a size (number of bits) included in each entry of the RAM data 606. For example, if the ways of the MSMC 200 support 16 bit entries in the RAM data 606, a memory address may correspond to a tag if the memory address falls within [tag, tag+F].

In an illustrative example of the coherency controller 224 operating according to the first row 702 using the table 600, in response to receiving a read request from a master peripheral connected to the first coherent slave interface 206A for a memory address corresponding to the tag 0x62349FA3CA35, the coherency controller 224 applies the tag to the cache tag banks 216 and determines that there is a hit in the RAM banks 218 for this address. Further, the coherency controller 224 determines that the snoop state associated with this address is INVALID. Accordingly, the coherency controller 224 retrieves the value cached in the RAM banks 218 (e.g., 5321) and returns this value to the master peripheral connected to the first coherent slave interface 206A. The coherency controller 224 does not issue a snoop request to the master peripherals because the snoop filter data 604 indicates that the caches of the master peripherals do not store a valid value for the address 0x62349FA3CA35.

A second row 704 of the table 700 illustrates that, in response to receiving a read request for a memory address corresponding to a tag that is cached in the RAM banks 218 (e.g., L3 cache data hit) and for which the snoop filter data 604 indicates the snoop state is CPU*_SHARED, the coherency controller 224 is configured to return a value of the tag from the RAM banks 218 without performing a snoop of the master peripherals.

In an illustrative example of the coherency controller 224 operating according to the second row 704 using the table 600, in response to receiving a read request from a master peripheral connected to the first coherent slave interface 206A for a memory address corresponding to the tag 0x23AEF5939DEA, the coherency controller 224 applies the tag to the cache tag banks 216 and determines that there is a hit in the RAM banks 218 for this address. Further, the coherency controller 224 determines that the snoop state associated with this address is 011_SHARED (e.g., that a master peripheral with identifier 011 caches a value of 0x23AEF5939DEA in a shared state). Accordingly, the coherency controller 224 retrieves the value cached in the RAM banks 218 (e.g., ABCD) and returns this value to the master peripheral connected to the first coherent slave interface 206A. The coherency controller 224 does not issue a snoop request to the master peripheral 011 because the snoop filter data 604 indicates that the master peripheral 011 stores a value of the address 0x62349FA3CA35 in a shared state and should provide updates to the coherency controller 224 in response to changing the value of the address 0x62349FA3CA35.

A third row 706 and a fourth row 708 indicate that, in response to receiving a read request for a memory address corresponding to a tag that is cached in the RAM banks 218 and for which the snoop filter data 604 indicates the snoop state is CPU*_UNIQUE, the coherency controller 224 is configured to issue a snoop request to CPU* (the master peripheral that owns the tag). The third row 706 indicates that the coherency controller 224 is configured to, in response to receiving a value of the tag from the CPU*, the coherency controller 224 is configured to return the value received from the CPU* instead of the value stored in the RAM banks 218. The fourth row 708 indicates that the coherency controller 224 is configured to, in response to receiving not receiving a value (e.g., receiving an indication that the CPU* generated a cache miss in response to the tag, receiving an indication that the cache of the CPU* stores an invalid value for the tag, determining that a timeout period has elapsed, etc.), the coherency controller 224 is configured to return the value store din the RAM banks 218.

In an illustrative example of the coherency controller 224 operating according to the third row 706 and the fourth row 708 using the table 600, in response to receiving a read request from a master peripheral connected to the first coherent slave interface 206A for a memory address corresponding to the tag 0x23AEF5939DEB, the coherency controller 224 applies the tag to the cache tag banks 216 and determines that there is a hit in the RAM banks 218 for this address. Further, the coherency controller 224 determines that the snoop state associated with this address is 001_UNIQUE (e.g., that a master peripheral with identifier 001 caches a value of 0x23AEF5939DEB in a unique state). Accordingly, the coherency controller 224 issues a snoop request to the master peripheral 001 to attempt to retrieve a value of the value of the tag 0x23AEF5939DEB stored by the master peripheral 001. If the coherency controller 224 receives a value for the tag 0x23AEF5939DEB from the master peripheral 001 in response to the snoop request, the master peripheral 001 returns that value to the master peripheral connected to the first coherent slave interface 206A without accessing the RAM banks 218, but if no value for the tag 0x23AEF5939DEB is received from the master peripheral 001, the coherency controller 224 returns the value for the tag 0x23AEF5939DEB stored in the RAM banks 218 (e.g., 3210 in FIG. 6).

A fifth row 710 of the table 700 illustrates that, in response to receiving a write request for a memory address that is cached in the RAM banks 218 (e.g., L3 cache data hit) and for which the snoop filter data 604 indicates the snoop state is INVALID, the coherency controller 224 is configured to write a value of the memory address from the RAM banks 218 without performing a snoop of the master peripherals. The coherency controller 224 may write a new value to the RAM banks 218 based on the write request. It should be noted that the write request may specify a data value that uses fewer bits than the value stored for the memory address by the RAM banks 218. Accordingly, the coherency controller 224 may utilize a mask to update a portion of the value stored in the RAM banks 218 based on the data value specified in the write request (e.g., using an address offset from the tag to the memory address indicated in the write request).

In an illustrative example of the coherency controller 224 operating according to the fifth row 710 using the table 600, in response to receiving a write request from a master peripheral connected to the first coherent slave interface 206A to write a value "1" to a memory address corresponding to the tag 0x62349FA3CA35, the coherency controller 224 applies the tag to the cache tag banks 216 and determines that there is a hit in the RAM banks 218 for this address. Further, the coherency controller 224 determines that the snoop state associated with this address is INVALID. Accordingly, the coherency controller 224 writes the value "1" to the third way of the RAM banks 218. The coherency controller 224 may write the value "1" apply a mask to overwrite a portion of value 5321 stored in the third way of the first group. For example, if the memory address identified by the write request is equal to the tag stored in the tag data 602, an offset identified for the write request is "0", accordingly, the coherency controller 224 may overwrite the "5" in the 0th position of "5321" with a "1" and store "1321" in the RAM banks 218. The coherency controller 224 may further return an indication of a successful write to the master peripheral connected to the first coherent slave interface 206A. Additionally, the coherency controller 224 may issue a write request to the external memory interleave 220 to write "1321" to memory address 0x62349FA3CA35 through the external memory master interfaces 222.

A sixth row 712 of the table 700 illustrates that, in response to receiving a write request for a memory address corresponding to a tag that is cached in the RAM banks 218 (e.g., L3 cache data hit) and for which the snoop filter data 604 indicates the snoop state is CPU*_SHARED, the coherency controller 224 is configured to issue a snoop request to the master peripheral identified by CPU* and to access the RAM banks 218. The snoop request to the master peripheral CPU* may request that the master peripheral identified by CPU* writeback and invalidate the value cached by the master peripheral for the tag. The coherency controller 224 may further be configured to issue snoop requests to all master peripherals indicating that values for the tag are to be set to the invalid state. The coherency controller 224 may update the RAM banks 218 based a value included in the write request and based on a value returned by the master peripheral CPU*. The coherency controller 224 may further issue a write request to output the updated value to the external memory interleave 220 for output to the external memory master interfaces 222. It should be noted that the coherency controller 224 may not issue a snoop request to the master peripheral CPU* in examples in which the master peripheral CPU* is the master peripheral that issued the write request. The coherency controller 224 is further configured to return a write status indicator to the master peripheral that originated the write request.

In an illustrative example of the coherency controller 224 operating according to the sixth row 712 using the table 600, in response to receiving a write request from a master peripheral connected to the first coherent slave interface 206A to write a value of "3" to a memory address corresponding to the tag 0x23AEF5939DEA, the coherency controller 224 applies the tag to the cache tag banks 216 and determines that there is a hit in the RAM banks 218 for this address. Further, the coherency controller 224 determines that the snoop state associated with this address is 011_SHARED (e.g., that a master peripheral with identifier 011 caches a value of 0x23AEF5939DEA in a shared state). Accordingly, the coherency controller 224 issues a snoop request to the 011 master peripheral to cause the 011 master peripheral to writeback (to the MSMC 200) and invalidate the 011 master peripheral's cached value for 0x23AEF5939DEA. The coherency controller 224 further issues snoop requests to the other master peripherals instructing the other master peripherals to invalidate entries for the tag 0x23AEF5939DEA. The coherency controller 224 overwrites a value returned by the master peripheral 011 responsive to the writeback request with the value "3" and stores the new value in the RAM banks 218 in place of "ABCD." In some implementations, the coherency controller further issues a write request to the external memory interleave 220 to write the new value to memory connected to the external memory master interfaces 222. In addition, the coherency controller 224 sends a notification to the master peripheral connected to the first coherent slave interface 206A indicating a successful write.

A seventh row 714 of the table 700 illustrates that, in response to receiving a write request for a memory address corresponding to a tag that is cached in the RAM banks 218 (e.g., L3 cache data hit) and for which the snoop filter data 604 indicates the snoop state is CPU*_UNIQUE, the coherency controller 224 is configured to issue a snoop request to the master peripheral identified by CPU* and to access the RAM banks 218. The snoop request to the master peripheral CPU* may request that the master peripheral identified by CPU* writeback (to the MSMC 200) invalidate the value cached by the master peripheral for the tag. The coherency controller 224 may then update the RAM banks 218 based a value included in the write request. The coherency controller 224 may further issue a write request to the external memory interleave 220 for output to the external memory master interfaces 222. It should be noted that the coherency controller 224 may not issue a snoop request to the master peripheral CPU* in examples in which the master peripheral CPU* is the master peripheral that issued the write request.

In an illustrative example of the coherency controller 224 operating according to the seventh row 714 using the table 600, in response to receiving a write request from a master peripheral connected to the first coherent slave interface 206A to write a value of "3" to a memory address corresponding to the tag 0x23AEF5939DEB, the coherency controller 224 applies the tag to the cache tag banks 216 and determines that there is a hit in the RAM banks 218 for this address. Further, the coherency controller 224 determines that the snoop state associated with this address is 001_UNIQUE (e.g., that a master peripheral with identifier 001 caches a value of 0x23AEF5939DEB in a unique state). Accordingly, the coherency controller 224 issues a snoop request to the 001 master peripheral to cause the 001 master peripheral to writeback and invalidate the 001 master peripheral's cached value for 0x23AEF5939DEB. As an example, the master peripheral may return "0000" as the cached value for 0x23AEF5939DEB. Accordingly, the coherency controller 224 overwrites "0000" or a portion thereof with "3" resulting in "3000," for example, and stores "3000" in the RAM banks 218 on the way associated with the address 0x23AEF5939DEB. Further, the coherency controller 224 may issue a request to write "3000" to the address 0x23AEF5939DEB to the external memory interleave 220 for output to the external memory master interfaces 222. In addition, the coherency controller 224 returns an indication of a successful write to the master peripheral connected to the first coherent slave interface 206A.

An eighth row 716 of the table 700 illustrates that, in response to receiving a read request for a memory address corresponding to a tag that is not cached in the RAM banks 218 (e.g., L3 cache data miss) and for which the snoop filter data 604 indicates the snoop state is INVALID, the coherency controller 224 is configured to issue a read request to the external memory interleave 220 to be forwarded to one of the external memory master interfaces 222. The coherency controller 224 receives a response to the read request sent to the external memory interleave 220 and returns a result to the master peripheral accordingly. Further, the coherency controller 224 may update the snoop filter banks 212A, cache tag banks 216, and RAM banks 218 based on a result.

In an illustrative example of the coherency controller 224 operating according to the eighth row 716 using the table 600, in response to receiving a read request from a master peripheral connected to the first coherent slave interface 206A for a memory address corresponding to the tag 0x52955AC3F329, the coherency controller 224 applies the tag to the cache tag banks 216 and determines that there is a miss in the RAM banks 218 for this address. Further, the coherency controller 224 determines that the snoop state associated with this address is INVALID. Accordingly, the coherency controller 224 issues a request to the external memory interleave 220 to retrieve data for the tag 0x52955AC3F329 from the external memory master interfaces 222. Once the coherency controller 224 receives data for the tag 0x52955AC3F329, the coherency controller 224 may update the RAM bank 218 to store the data for the tag 0x52955AC3F329 and send the data for the tag 0x52955AC3F329 to the master peripheral connected to the first coherent slave interface 206A. In addition, the coherency controller 224 may set a snoop state for the tag 0x52955AC3F329 in the snoop filter banks 212 to indicate that the master peripheral connected to the first coherent slave interface 206A has data for the tag 0x52955AC3F329. The state may be one of CPU*_SHARED and CPU*_UNIQUE and may be selected based on the read request received from the master peripheral connected to the first coherent slave interface 206A. For example, a read request from the master peripheral may indicate that the master peripheral will cache a received value in the shared state or that the master peripheral will cache the received value in the unique state. In some implementations, the coherency controller 224 is configured to "promote" an initial request for data (e.g., a request that for data for which no snoop filter state exists or for which a snoop filter state is INVALID) from a request for shared access to request for unique access.

A ninth row 718 and a tenth row 720 of the table 700 illustrate that, in response to receiving a read request for a memory address corresponding to a tag that is not cached in the RAM banks 218 (e.g., L3 cache data miss) and for which the snoop filter data 604 indicates the snoop state is CPU*_SHARED, the coherency controller 224 is configured to issue a snoop request (e.g., a snoop read) to the master peripheral identified by CPU*. In response to receiving data for the tag in response to the snoop request, the coherency controller 224 is configured to output the data to the requesting master peripheral without accessing the external master memory interfaces 222. Further, the coherency controller 224 may update the RAM banks 218 to store the data. In response to receiving no data for the tag in response to the snoop request (e.g., a timeout, an invalid indication, a cache miss indication, etc.) the coherency controller 224 is configured to issue a request to the external memory interleave 220. In response to receiving data from the external memory interleave 220, the coherency controller 224 is configured to return the data to the requesting master peripheral. In addition, the coherency controller 224 may update the RAM banks 218 to store the data and update the snoop filter banks 212 to indicate that the data associated with the tag is invalid for CPU*.

In an illustrative example of the coherency controller 224 operating according to the ninth row 718 and the tenth row 720 using the table 600, in response to receiving a read request from a master peripheral connected to the first coherent slave interface 206A for a memory address corresponding to the tag 0x8E3256088321, the coherency controller 224 applies the tag to the cache tag banks 216 and determines that there is a miss in the RAM banks 218 for this tag. Further, the coherency controller 224 determines that the snoop state associated with this address is 001_SHARED (e.g., that a master peripheral with identifier 001 caches a value of 0x8E3256088321 in a shared state). Accordingly, the coherency controller 224 issues a snoop request to the 001 master peripheral in an attempt to retrieve its cached value for 0x8E3256088321. If the 001 master peripheral returns a value for 0x8E3256088321, the coherency controller 224 is configured to return the value to the master peripheral connected to the first coherent slave interface 206A without accessing the external memory master interfaces 222. Further, the coherency controller 224 may update the RAM banks 218 so that the RAM data 606 includes the value of tag 0x8E3256088321. If the 001 master peripheral does not return a value for 0x8E3256088321, the coherency controller 224 is configured to send a read request for the tag 0x8E3256088321 to the external memory interleave 220. The external memory interleave 220 is configured to pass the request to one of the external memory master interfaces 222 and return a received result to the coherency controller 224. The coherency controller 224 is configured to return the result to the master peripheral connected to the first coherent slave interface 206A and may update the RAM banks 218 so that the RAM data 606 includes the value of tag 0x8E3256088321. Further, the coherency controller 224 may update the snoop filter bank 212 to indicate that data for the 0x8E3256088321 tag is INVALID (or non-existent) at the 001 master peripheral.

An eleventh row 722 and a twelfth row 724 of the table 700 illustrate that, in response to receiving a read request for a memory address corresponding to a tag that is not cached in the RAM banks 218 (e.g., L3 cache data miss) and for which the snoop filter data 604 indicates the snoop state is CPU*_UNIQUE, the coherency controller 224 is configured to perform the same basic actions as if the snoop state were CPU*_SHARED. However, in addition, the coherency controller 224 may be configured to update the snoop filter banks 212 to indicate that the snoop filter state for the tag is CPU*_SHARED and to send a snoop request instructing the CPU* to change its cache state to shared for the tag.

A thirteenth row 726, a fourteenth row 728, and a fifteenth row 730 illustrate that the coherency controller 224 is configured to respond to write requests for addresses corresponding to tags not cached in the RAM banks 218 as shown in rows 610-614 except utilizing the external memory interleave 220 to access the external memory master interfaces 222 rather than utilizing the RAM banks 218.

As illustrated in the table 700, the coherency controller 224 need not issue snoop requests to the master peripherals in response to every request because the snoop filter includes state information. Accordingly, the MSMC 200 may snoop the master peripherals less frequently as compared to coherency systems that do not maintain snoop filter data. Further, as shown in FIG. 2, because the snoop filter banks 212 are connected to the same cache tag banks 216 as the RAM banks 218, the hardware snoop filter may be implemented using fewer components as compared to implementations that include separate cache tag banks for snoop filter banks and RAM banks. Further, the coherency controller 224 is configured to access each snoop filter bank-cache tag bank-RAM bank grouping in parallel.

While not illustrated in FIG. 7, the coherency controller 224 may be configured to issue no snoop requests for a tag in response to determining that corresponding snoop filter state is BROADCAST_SHARED and that data for the tag is cached in the RAM banks 218. Alternatively, the coherency controller 224 may be configured to broadcast snoop requests to all master peripherals in response to determining that the snoop filter state is BROADCAST_UNIQUE or in response to determining that the snoop filter state is BROADCAST_SHARED but no data for the tag is cached in the RAM banks 218.

Figure 8:
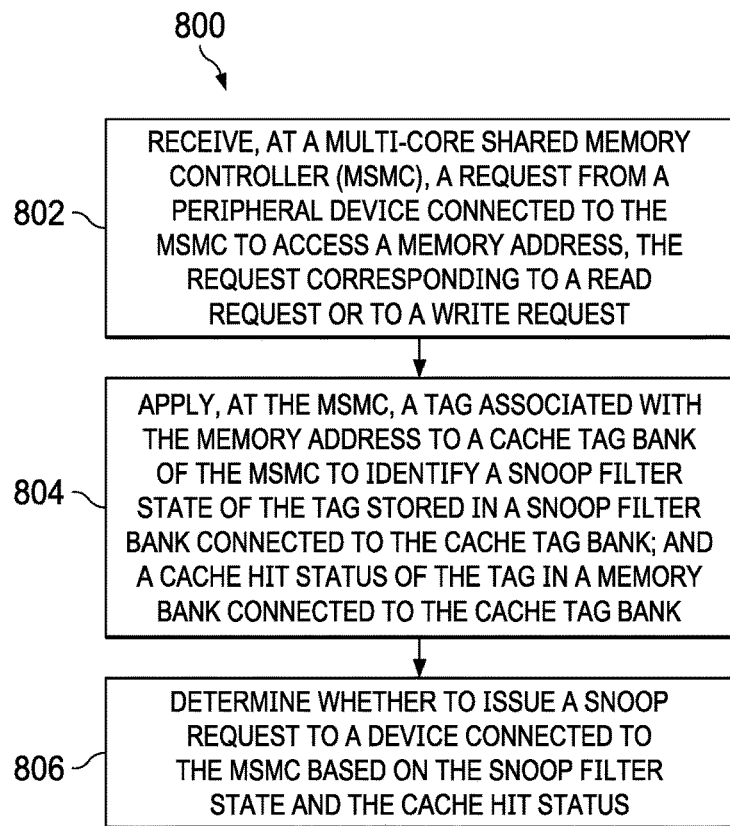
FIG. 8 is a flowchart illustrating a method of processing memory access requests.

Referring to FIG. 8, a flowchart illustrating a method 800 of processing memory access requests is shown. The method 800 may be performed by a multi-core shared memory controller, such as the MSMC 200 of FIG. 2. The method 800 includes receiving, at a MSMC, a request from a peripheral device connected to the MSMC to access a memory address, the request corresponding to a read request or to a write request. For example, the MSMC 200 may receive a read request or a write request from a master peripheral connected to one of the coherent slave interfaces 206 (e.g., one of the processor packages 104 or another master peripheral).

The method 800 further includes applying, at the MSMC, a tag associated with the memory address to a cache tag bank of the MSMC to identify a snoop filter state of the tag stored in a snoop filter bank connected to the cache tag bank and a cache hit status of the tag in a memory bank connected to the cache tag bank, at 804. For example, the coherency controller 224 may determine a tag associated with the address identified by the read or write request (e.g., by masking out a number of least significant bits of the address). The coherency controller 224 may further apply the tag to the cache tag banks 216 to determine a snoop filter state for the tag stored in the snoop filter banks 212 and to determine a cache hit status of the tag in the RAM banks 218. In some implementations, the coherency controller 224 selects which snoop filter bank-cache tag bank-RAM bank group to search based on the tag (e.g., based on one or more most significant bits of the tag). The cache hit status indicates whether a value associated with the tag is stored in the RAM banks 218 (e.g., a cache hit) or not (e.g., a cache miss).

The method 800 further includes determining whether to issue a snoop request to a device connected to the MSMC based on the snoop filter state and the cache hit status, at 806. For example, the coherency controller 224 may determine whether to issue snoop requests to one or more master peripherals connected to the coherent slave interfaces 206 based on the snoop filter state and the cache hit status as illustrated in FIG. 6 and described in the corresponding description above. Accordingly, the MSMC 200 may provide coherent memory accesses without issuing snoop requests in response to every memory access request.

Figure 9:
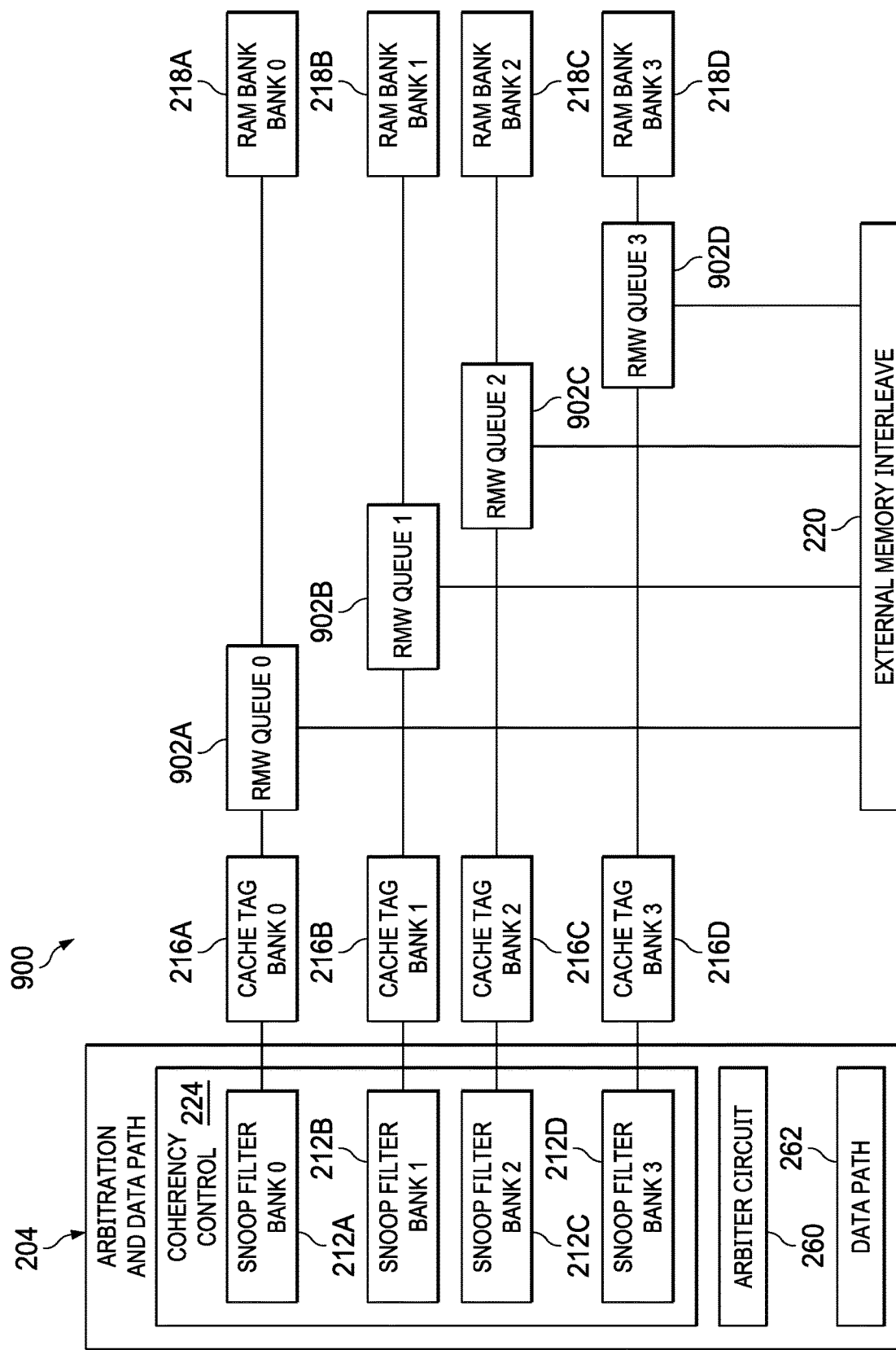
FIG. 9 is a diagram illustrating read-modify-write queues included in the MSMC.

Referring to FIG. 9, a diagram 900 illustrating read-modify-write (RMW) queues that may be included in the MSMC 200 is shown. The diagram 900 illustrates that the MSMC 200 may include a RMW queue 902 for each of the RAM banks 218. Each RMW queue 902 is configured to receive read and write requests from the data path 262 for memory addresses associated with the corresponding RAM bank 218. Memory addresses associated with a RAM bank include addressable memory addresses within the RAM bank as well as memory addresses of an external memory device that are allocated to ways of the RAM bank. For example, a first RMW queue 902A may receive read/write request for addressable memory within the first RAM bank 218A or a read/write request. The RMW queues 902 perform credit based arbitration (as described further herein) to arbitrate between requests while maintaining a sequence of requests to access a particular memory address. For example, the RMW queues 902 may ensure that an order of a sequence of requests to access memory address A is maintained when the sequence of requests is output to the RAM banks 218 and/or the external memory interleave 220. Further, the RMW queues 902 are configured to support writes of data that include fewer bits than a number of bits stored at a memory address in an addressable memory space (e.g., within an external memory device or one of the RAM banks 218) or at data cache entry included in the RAM banks 218. The RMW queues 902 may align the written bits (e.g., based on an offset) with the data in memory and write over a portion of the data corresponding to the written data while the remainder of the data in memory.

Figure 10:
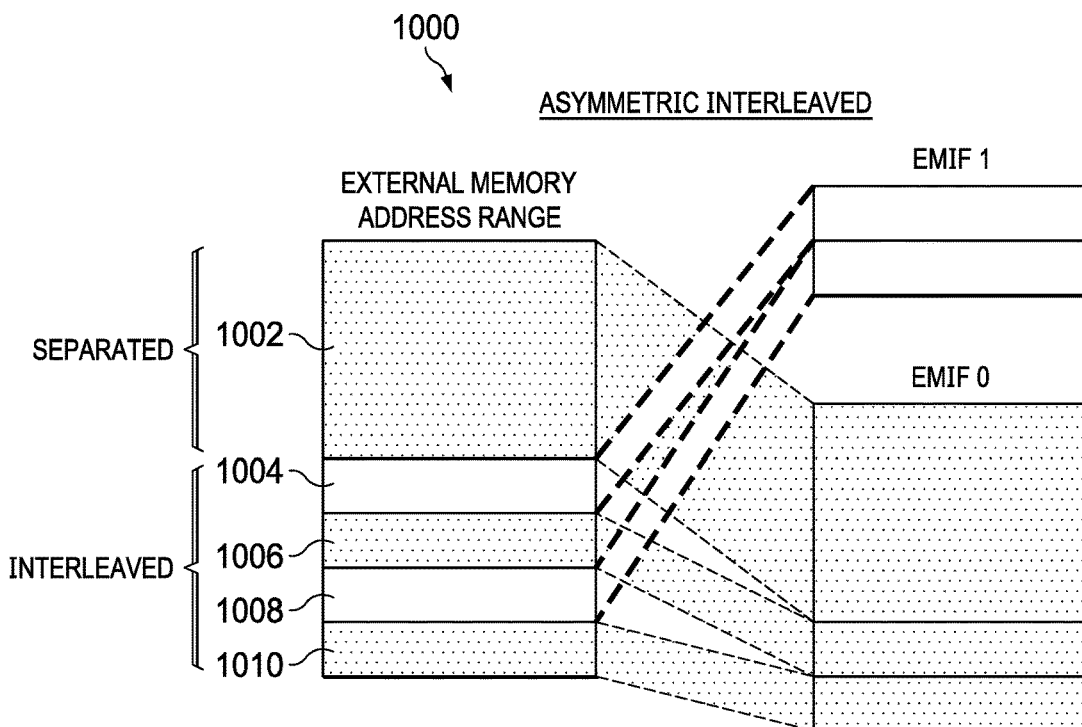
FIG. 10 is a diagram illustrating asymmetrical interleaving of memory spaces to form an external memory address range accessible to devices connected to the MSMC.

The external memory interleave 220 outputs read and write requests to the external memory master interfaces 222. The external memory interleave 220 may perform credit based arbitration to select which request (or requests) to output to the external memory master interfaces 222 each clock cycle as described further herein. Further, the external memory interleave 220 is configured to interleave accesses to the external memory master interfaces 222 (and the external memory devices connected to the external memory master interfaces 222) by interleaving a memory space of the external memory devices connected to the external memory master interfaces 222. FIG. 10 illustrates a first example in which the external memory interleave 220 divides a memory space asymmetrically between memory devices. The external memory interleave 220 may implement asymmetrical interleaving as shown in FIG. 10 in examples in which external memory devices connected to the external memory master interfaces 222 have different storage capacities. In an asymmetrical interleave scheme, the external memory interleave 220 interleaves addresses (or equally sized ranges of addresses) of the external memory devices connected to the external memory interface to form an address space until the external memory interleave 220. Further, the external memory interleave 220 adds a separated range of addresses from the relatively larger external memory device to the interleaved address space to form an external memory address range addressable by devices connected to the MSMC 200. In the illustrated example, an external memory address range supported by the MSMC 200 is generated from a first external memory device "EMIF 0" and a second external memory device "EMIF 1". EMIF 1 has a large capacity than the EMIF 0. The external memory interleave 220 generates the external memory address range by interleaving ranges 1010 and 1006 from the EMIF 0 with address ranges 1004 and 1008 from the EMIF 1. A remaining range of addresses 1002 from the EMIF 0 is added to the external memory address range.

Figure 11:
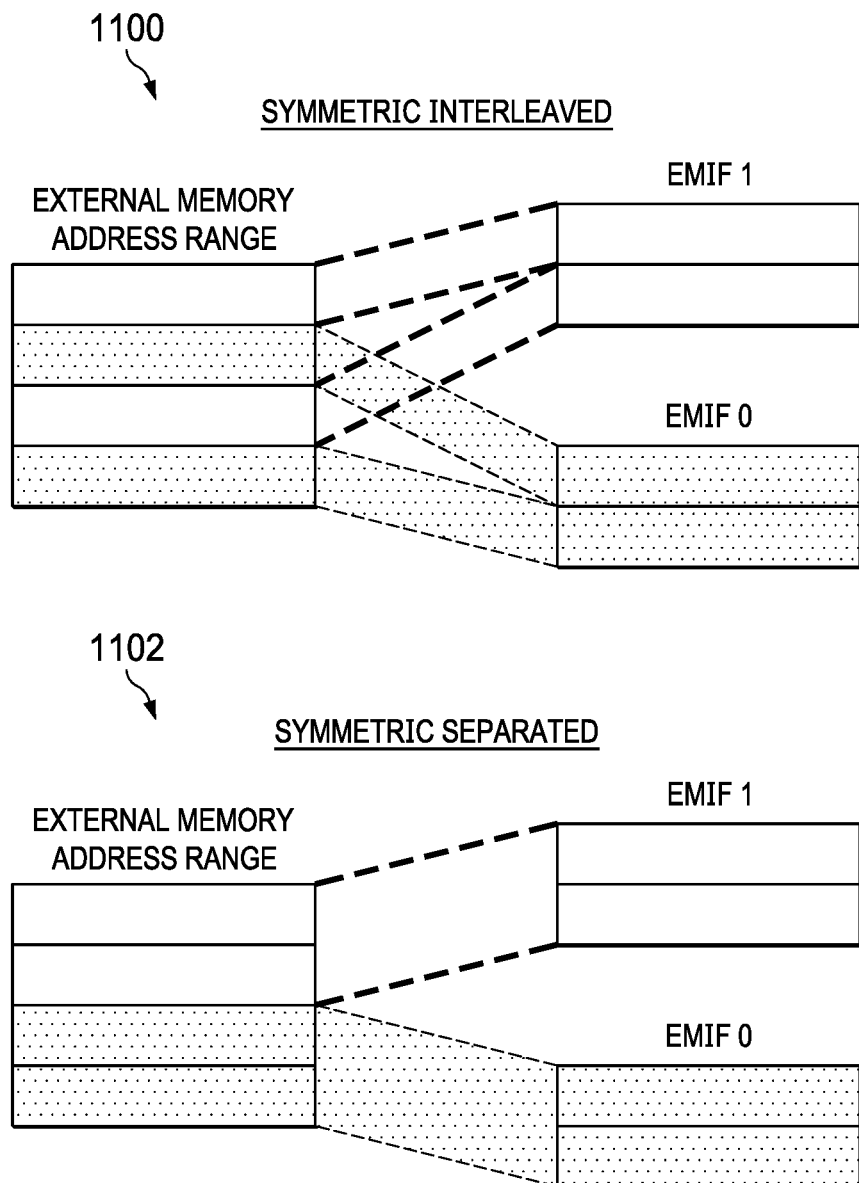
FIG. 11 is a diagram illustrating symmetrical interleaving of memory spaces to form an external memory address range accessible to devices connected to the MSMC.

FIG. 11 illustrates that the external memory interleave 220 may interleave or separate memory addresses from symmetrical external memory devices to form an external memory address range addressable by devices connected to the MSMC 200. The In a first example 1100, address ranges from two external memory devices are interleaved evenly while, in a second example 1102, address ranges from two external memory devices are separated into two distinct ranges within the external memory address range. Thus, FIGS. 10-11 illustrate different techniques the external memory interleave 220 may use to combine memory address spaces from a plurality of external memory devices into an external memory address range addressable by devices connected to the MSMC 200. Because the external memory address range addressable by devices connected to the MSMC 200 includes address ranges corresponding to different external memory devices, memory access requests (e.g., reads and writes) to the external memory address range are routed to different ones of the external memory master interfaces 222. Accordingly, accesses to the external memory master interfaces 222 are interleaved based on the addressing scheme applied by the external memory interleave 220.

Figure 12:
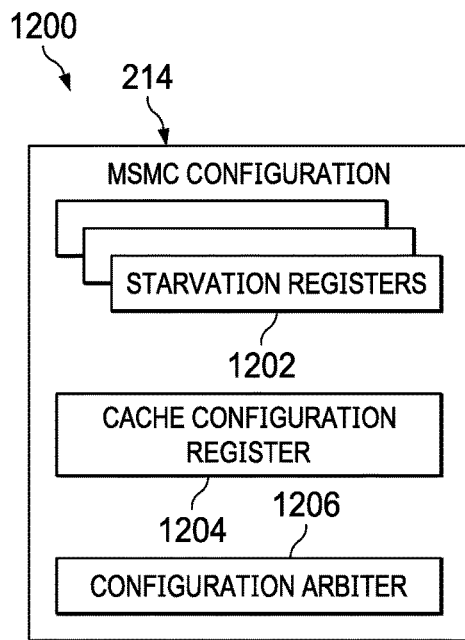
FIG. 12 is a diagram of a MSMC configuration module.

Referring to FIG. 12, detail of the MSMC configuration module 214 is shown. As illustrated, the MSMC configuration module 214 includes one or more starvation registers 1202, a cache configuration register 1204, and a configuration arbiter 1206. The MSMC configuration module 214 may include more or fewer components and depicted components may be combined into a single component or split into a plurality of components. The configuration arbiter 1206 is configured to perform credit based arbitration of requests to read from or write to the cache configuration register 1204 and the starvation registers 1202 received via the common data path 262. As described further herein, such arbitration may be credit based. The cache configuration register 1204 may correspond to the MMR 302 of FIG. 3. The starvation registers 1202 are configured to store starvation bound values associated with the coherent slave interfaces 206. As explained herein, the starvation bound values indicate a tolerance of requests from a master peripheral to request starvation. These starvation bound values may be set based on requests received from the coherent slave interfaces 206 through the data path 262. The cache configuration register 1204 stores settings indicating which ways of the MSMC 200 are allocated to cache space and which ways of the MSMC 200 are addressable by the master peripherals for data storage. Further, the cache configuration register 1204 may store a value identifying which ways of the MSMC 200 are to be used for "real-time" requests and which ways of the MSMC 200 are to be used for "non-real time" requests. For example, the cache configuration register 1204 may store one or more bit masks usable by the coherency controller 224 to allocate ways to a "real-time" priority or to a "non-real-time priority."

Figure 13:
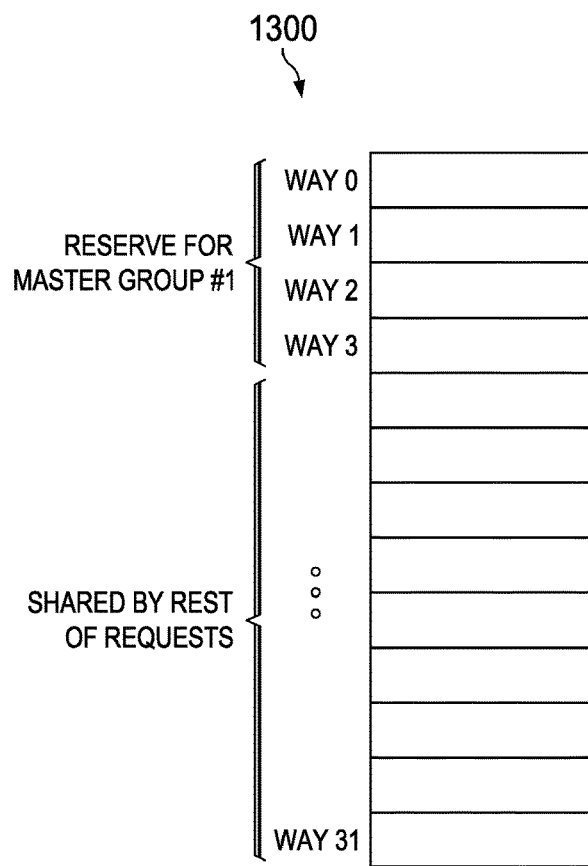
FIG. 13 is a diagram of ways allocated between different groups of master peripherals.

FIG. 13 illustrates a diagram 1300 of ways of the MSMC 200 allocated between a master group #1 and a remainder of master peripherals. The master group #1 may correspond to peripherals associated with the "real-time" priority. The cache configuration register 1204 may be configured to store an indication (e.g., received from the master peripheral) of what group each master peripheral belongs to. In response to receiving a memory access request (e.g., a read or a write) from a master peripheral for a memory address not included in the cache tag banks 216, the coherency controller 224 is configured to allocate a way to a cache tag associated with a memory address indicated by the memory access request. The coherency controller 224 may determine the way based on the settings stored in the cache configuration register 1204.

Figure 14:
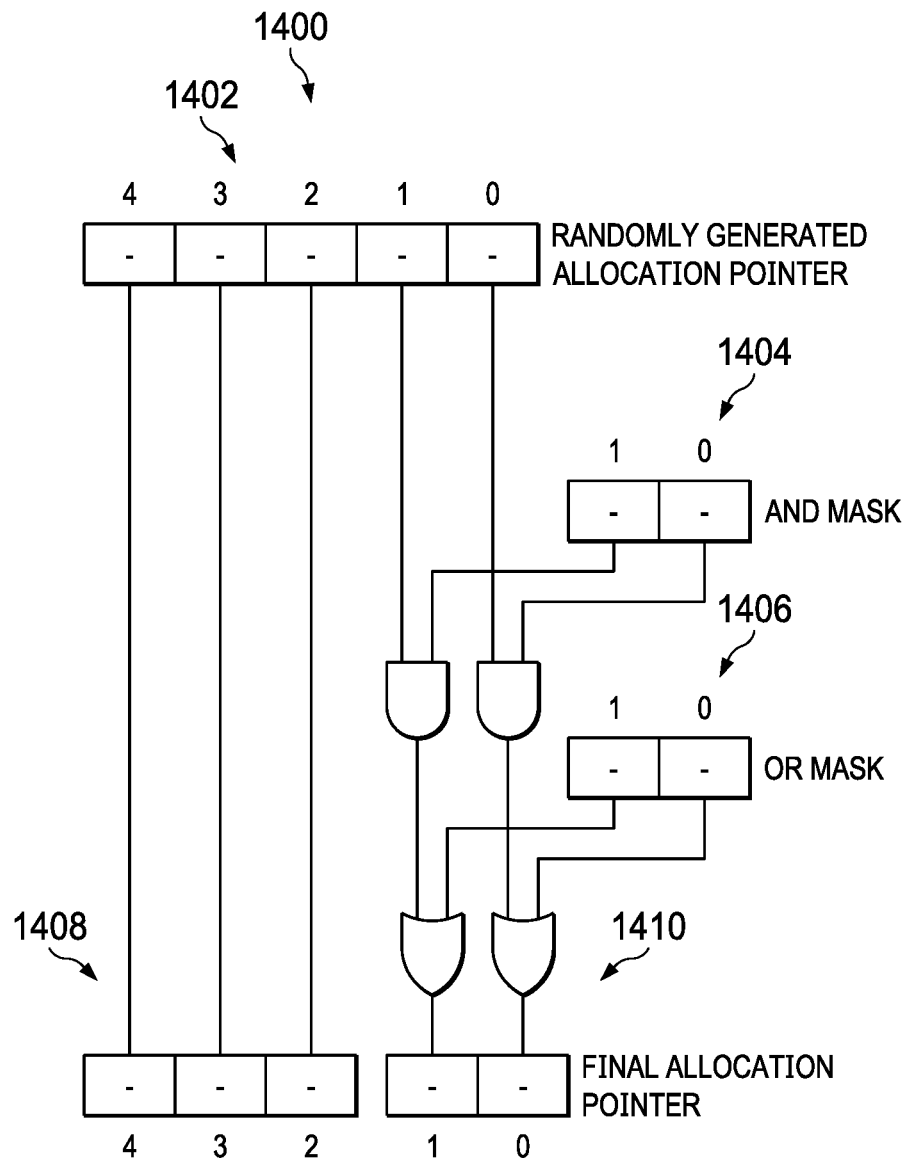
FIG. 14 is a diagram of circuitry for controlling cache tag allocation.

FIG. 14 depicts circuitry 1400 that may be included in the coherency controller 224 to allocate a way to a cache tag associated with a memory address included in a memory access request. The circuitry 1400 is configured to receive a randomly generated allocation pointer 1402, an AND mask 1404 and an OR mask 1406. The AND mask and the OR mask may be stored in the cache configuration register 1204. The coherency controller 224 may retrieve the AND mask 1404 and the OR mask 1406 based on a group membership of the master peripheral associated with the memory access request (e.g., whether the master peripheral is a real-time or non-real-time peripheral). The circuitry 1400 is configured to perform a first AND operation on a first bit of the randomly generated allocation pointer 1402 and a first bit of the AND mask 1404 and a second AND operation on a second bit of the randomly generated allocation pointer 1402 and a second bit of the AND mask 1404. The circuitry 1400 is configured to perform a first OR operation on a first bit of the OR mask 1406 and a result of the first AND operation and to perform a second OR operation on a second bit of the OR mask 1406 and a result of the second AND operation. A result of the first OR operation corresponds to a first bit of a way identifier 1410 and a result of the second OR operation corresponds to a second bit of the way identifier 1410. The circuitry 1400 is configured to output three most significant bits of the randomly generated allocation pointer 1402 as a group identifier 1408. The coherency controller 224 is configured to allocate a way identified by the way identifier 1410 in a way group identified by the way group identifier 1408 to the cache tag associated with the memory address identified by the request that prompted way allocation. The AND mask 1404 and the OR mask 1406 ensure that only ways assigned to the master peripheral (or master peripheral group) are selected by the circuitry 1400. Other types of way allocation circuitry may be included in the coherency controller 224 to allocate ways based on settings in the cache configuration register 1204.

As described above, the MSMC 200 includes a plurality of ways. A data portion of each way is included in one of the RAM banks 218, while a cache tag data portion of the way is included in corresponding one of the cache tag banks 216 and a snoop filter data portion of the way is included in a corresponding one of the snoop filter banks 212. The ways are arranged in groups (e.g., of 4). The coherency controller 224 is configured to allocate the ways of the MSMC 200 between storage space and cache space based on one or more settings included in the cache configuration register 1204. However, rather than assigning an entire group to storage or cache, the coherency controller 224 may individually allocate data portions of the ways to storage or cache. For example, way 2 of each group may be allocated to data (or cache) rather than allocating entire way groups to data or cache in blocks. Further, the snoop filter data and cache tag data for ways allocated to addressable storage may continue to be maintained by the coherency controller 224. Accordingly, the coherency controller 224 may continue to track data cached at the master peripherals even when ways are allocated to addressable storage.

Figure 15:
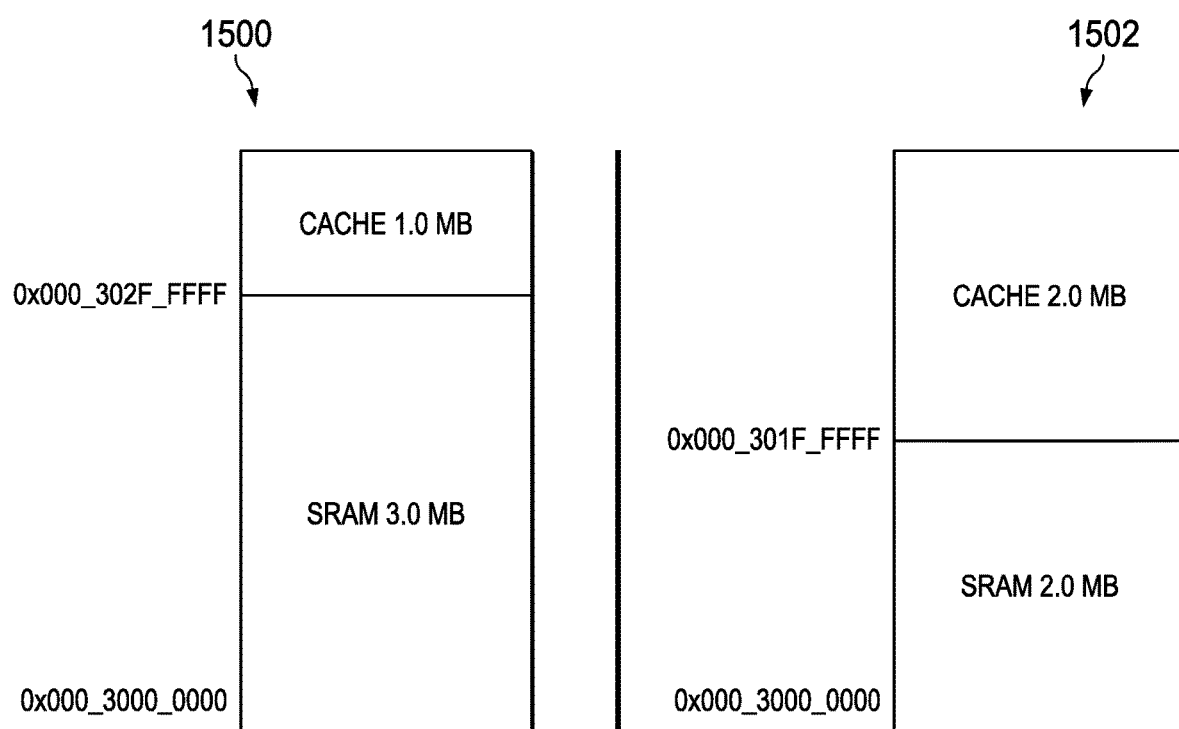
FIG. 15 is a diagram illustrating that data portions of ways within the MSMC may be allocated between addressable storage space and cache space.
Figure 16:
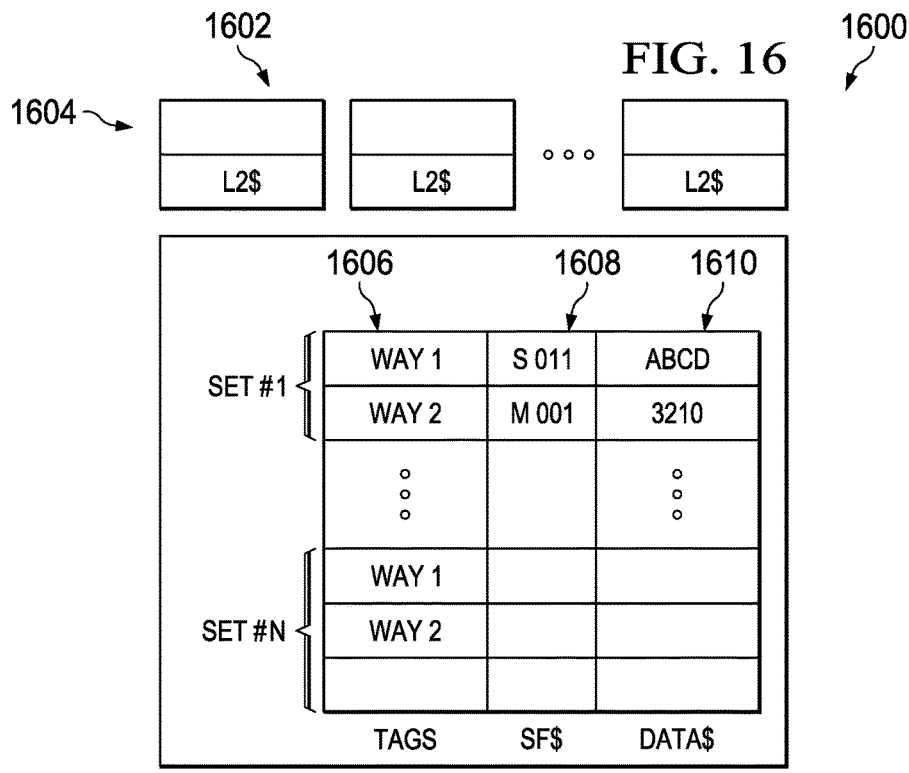
FIG. 16 depicts examples of different allocations of way data portions between cache and addressable storage space.
Figure 16:
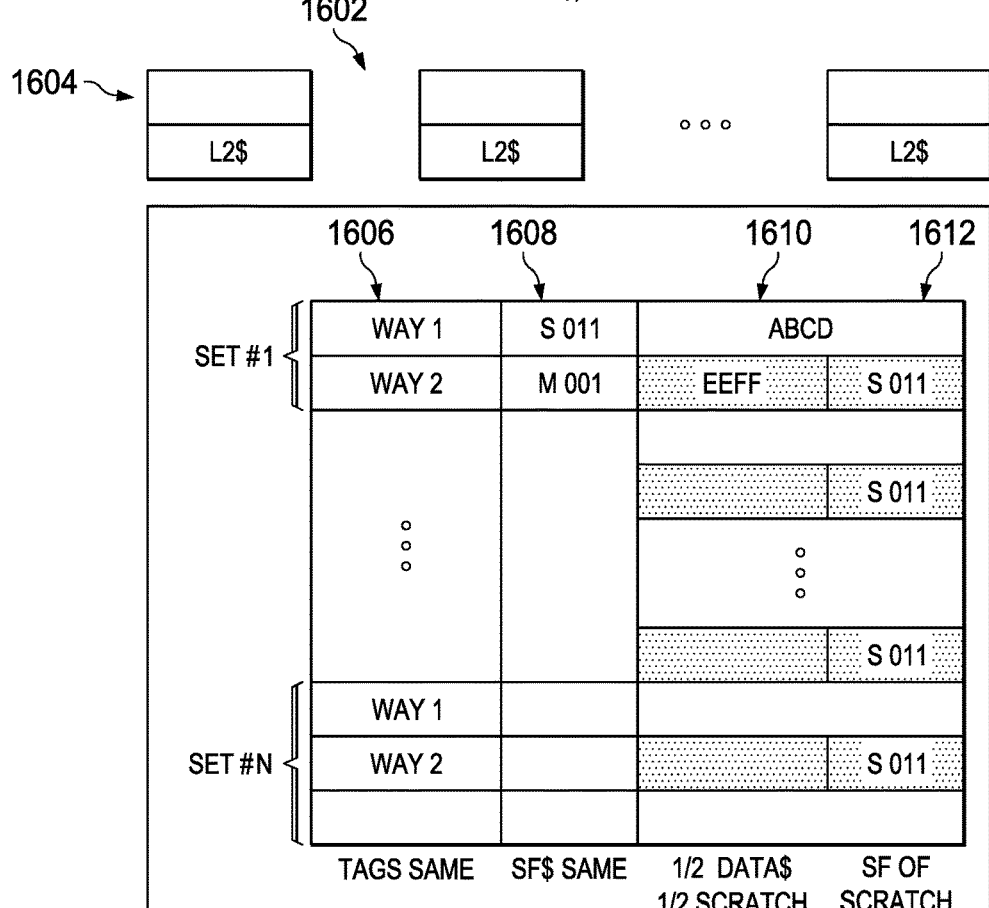

FIG. 15 illustrates that data portions of ways within the RAM banks 218 may be allocated between addressable storage space and cache space based on one or more settings in the cache configuration register 1204. FIG. 16 depicts examples of different allocations way data portions between cache and addressable memory space. In a first example, 1600 all way data portions are allocated to cache space. In the first example 1600, each cache tag portion 1606 of each way is configured to store a cache tag and each snoop filter data portion 1608 is configured to store a snoop filter state associated with the cache tag. The snoop filter data portion 1608 indicates a cache status of the cache tag identified by the cache tag data portion of the way in one or more caches of master peripherals 1604. The cache tag data portions 1606 correspond to the cache tag banks 216, the snoop filter data portions 1608 correspond to the snoop filter banks 212, and the data portions 1610 correspond to the RAM banks 218. The master peripherals 1604 may correspond to peripherals connected to the coherent slave interfaces 206 (e.g., may correspond to the processing clusters 102). The first example 1600 further illustrates that a data portion of each way includes a cached data value associated with the cache tag stored in the cache tag portion of the way.

Figure 17:
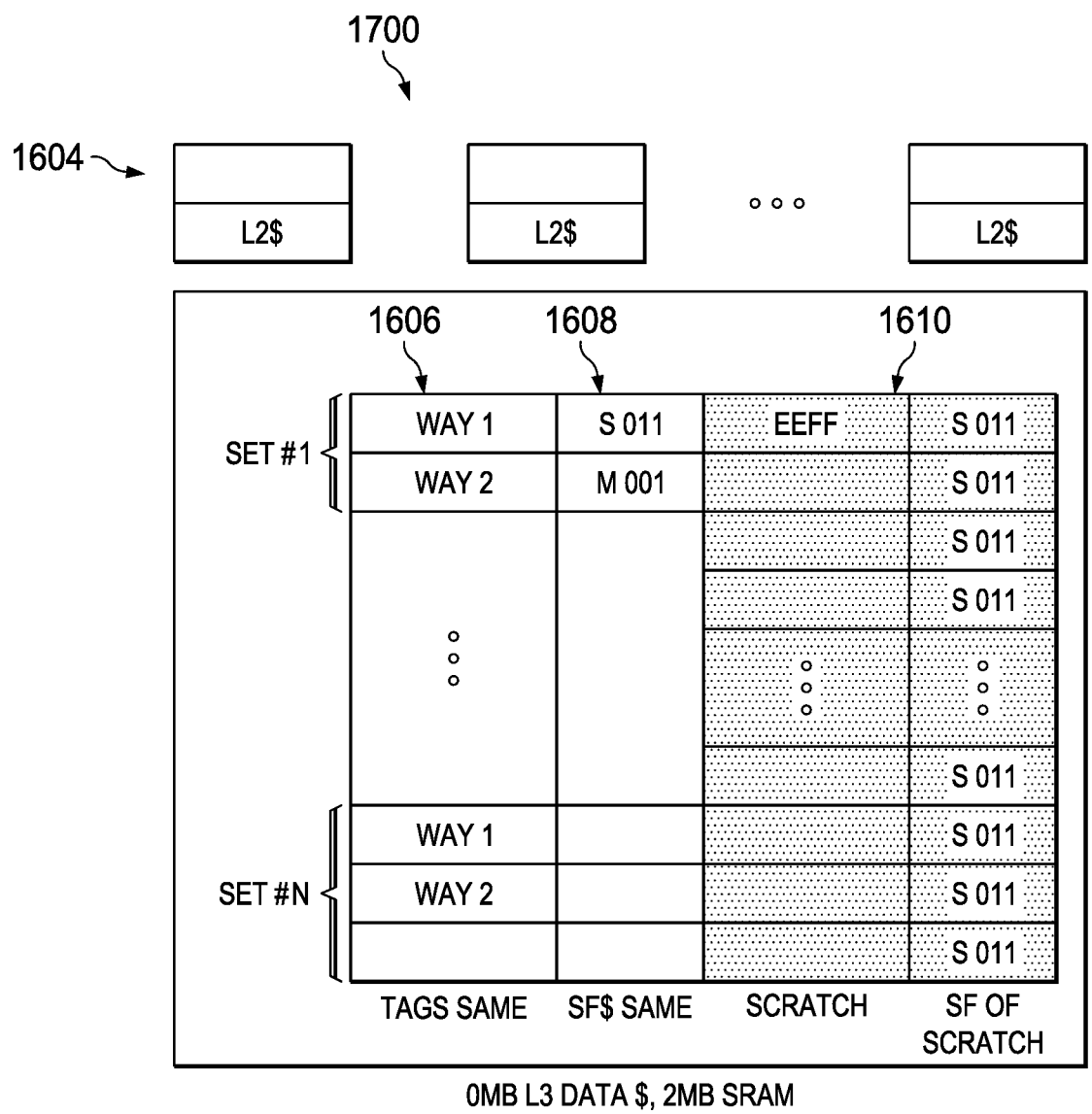
FIG. 17 depicts an example of data portions of all ways allocated to addressable storage space.

In a second example 1602, way 2 in each group (e.g., set) of ways is allocated to addressable memory. For example, in response a change in the configuration register 1204 the coherency controller 224 may allocate way 2 of each group to addressable memory space accessible by the master peripherals 1604. The coherency controller 224 is configured to divide the data portion 1610 of ways allocated to addressable data into a storage portion and into a storage snoop filter portion as shown in the data portion of way 2 1612 of group 1. The storage snoop filter portion stores a snoop filter state indicating a cache status of an address of the data portion of the way in the master peripherals 1604. In response a way being allocated to addressable memory space, the coherency controller 224 is configured to respond to read and write requests from the master peripherals 1604 to read data from or write data to a storage portion of the data portion of the way. Further, the coherency controller 224 is configured to update the storage snoop filter portion of the data portion of the way based on the memory access requests. Accordingly, the coherency controller 224 may track a snoop state of addressable data stored in the RAM banks 218. FIG. 17 illustrates a third example 1700 in which all of the ways are allocated to addressable storage and none of the ways are allocated to data cache.

In addition, to providing a configurable cache, the MSMC 200 is configured to establish virtual channels over the common data path 262 between components of the MSMC 200. The arbiter circuit 260 may be configured to establish the virtual channels by adding channel identifiers to requests before submitting the requests to the data path 262. Devices connected to the common data path 262 are configured to respond to particular virtual channel identifiers. To illustrate, the arbiter circuit 260 may receive a memory access request (e.g., a read or a write) from one of the coherent slave interfaces 206 and determine (e.g., in conjunction with the coherency controller 224) that the memory access request is to be fulfilled based on a read from the first RAM bank 218A. Accordingly, the arbiter circuit 260 may modify the memory access request (or generate a new request) to include a channel identifier recognized by the first RMW queue 902A associated with the first RAM bank 218A. The first RMW queue 902A may retrieve the memory access request for further processing in response to recognizing the channel identifier while other components e.g., the second RMW queue 902B ignores the memory access request. Because the MSMC 200 utilizes a shared data path rather than unique connections between each component, the MSMC 200 may include less wiring as compared to other devices.

The arbiter circuit 260 is configured to arbitrate access to the common data path 262 by various components of the MSMC 200 using a multi-layer arbitration technique. The arbiter circuit 260 is configured to track credits associated with each resource connected to the common data path. The credits associated with a resource may correspond to available space in one or more queues of the resource. Each request received by the arbiter circuit 260 has an associated credit cost. For each request under consideration by the arbiter circuit 260, the arbiter circuit 260 compares a credit cost of the request to a number of available credits. The arbiter circuit 260 is configured to select an arbitration winner from among requests having a credit cost that is less than or equal to a number of available credits at an associated resource. In response to there being more than one request having a credit cost less than or equal to an associated number of available credit cost, the arbiter circuit 260 is configured to consider priority, a sharing algorithm, or a combination thereof.

The arbiter circuit 260 may determine priority of a request based a source of the request and a setting in the cache configuration register 1204 and/or based on an indicator in the request. In some implementations, the arbiter circuit 260 is configured to select a winner from a relatively higher priority group (e.g., real time priority) each time a request from a relatively higher priority group is available. In other implementations, the arbiter circuit 260 is configured to select from the relatively higher priority group a particular number of times before selecting from a relatively lower priority group.

The arbiter circuit 260 may be configured to promote a request to a higher priority level in response to the request losing arbitration for a number of clock cycles that satisfies a starvation bound value (e.g., a starvation threshold) stored in a starvation register 1202. The starvation bound value may correspond to a source of the request (e.g., each of the coherent slave interfaces 206 may have a corresponding starvation bound value) or a group to which the source of the request belongs.

Between requests of the same priority, the arbiter circuit 260 may employ a sharing algorithm, such as fair-share or round robin, to select an arbitration winner. The sharing algorithm may be performed based on a source of the request to prevent a single requestor from dominating traffic on the common data path 262.

Once the arbiter circuit 260 selects a request as an arbitration winner, the arbiter circuit 260 is configured to drive the request (e.g., modified to identify a virtual channel) to the common data path 262 and decrements a number of available credits associated with a resource that is a target of the request by a credit cost of the request. The arbiter circuit 260 is configured to increase the number of credits available to the resource in response to receiving an acknowledgement that the request has been processed by the resource, based on passing of time, or a combination thereof.

Requests received by the arbiter circuit 260 may have different credit costs. In some implementations, the arbiter circuit 260 is configured to implement a credit hiding technique to prevent lower cost requests from monopolizing the common data path 262. According to the credit hiding technique, the arbiter circuit 260 is configured to "hide" credits associated with a resource in response to the number of credits associated with the resource falling to a lower credit threshold (e.g., zero credits). While the arbiter circuit 260 hides the credits associated with the resource, the arbiter circuit 260 selects no requests targeting the resource as an arbitration winner. The arbiter circuit 260 hides the credits for the resource until the number of credits available for the resource reaches an upper credit threshold. The upper credit threshold may be equal to a highest cost of possible requests for the resource that the arbiter circuit 260 is configured to receive. Accordingly, relatively lower credit cost requests for a resource may be prevented from "locking out" relatively higher credit cost requests for the resource once a number of available credits falls below the relatively higher credit cost. It should be noted that this credit hiding technique may be implemented by devices other than the arbiter circuit 260. For example, the credit hiding technique described herein may be implemented by an arbiter circuit (or by a processor executing arbitration instructions stored in a memory device) in any credit based arbitration system.

The arbiter circuit 260 is configured to perform arbitration in two phases in some implementations. In such implementations, the arbiter circuit 260 selects a pre-arbitration winner in a first clock cycle and selects a final arbitration winner in a second subsequent clock cycle. The arbiter circuit 260 may select the pre-arbitration winner in the first clock cycle using the multi-layer arbitration process described above during the first cycle. In the second clock cycle, the arbiter circuit 260 may compare a priority of the pre-arbitration winner to one or more priorities of subsequently received requests to determine a final arbitration winner and drive the final arbitration winner to the data path 262.

The arbiter circuit 260 may be configured to perform additional functions during the first clock cycle (e.g., during pre-arbitration). For example, during pre-arbitration, the arbiter circuit 260 may classify requests as destined for a local resource (e.g., within the MSMC 200) or destined for an external resource (e.g., an external memory device connected to the external memory master interfaces 222). The arbiter circuit 260 may further classify requests as blocking or non-blocking during pre-arbitration. Requests that may be stalled pending resolution of a snoop request are blocking requests. The arbiter circuit 260 is configured to ensure that blocking requests are granted access to the data path 262 in sequence to maintain coherency of memory managed by the MSMC 200. Further, the arbiter circuit 260 may place a non-blocking request on the data path 262 in advance of a previously received blocking request.

In addition to the arbiter circuit 260, the MSMC 200 includes further arbiters. For example, the MSMC configuration module 214 includes the configuration arbiter 1206 configured to arbitrate access to the starvation registers 120s and the cache configuration register 1204. Further, the MSMC 200 includes the RMW queues 902 configured to arbitrate access to the RAM banks 218 and the external memory interleave 220. In addition, the external memory interleave 220 is configured to arbitrate access to the external memory master interfaces 222. The RMW queues 902, the configuration arbiter 1206, and the external memory interleave 220 may implement the same multi-layer hybrid credit based arbitration technique as the arbiter circuit 260 to arbitrate between requests.

In addition to providing configurable cache and credit based arbitration, the MSMC 200 is configured to provide various error detection and correction functionalities. The arbiter circuit 260 is configured to generate a Hamming code for all data (e.g., in write requests) received from the coherent slave interfaces 206. The Hamming code may include an out of band Hamming code. In contrast to normal Hamming codes that intersperse code bits within data bits, the out of band Hamming code comprises a continuous sequence of code bits placed before or after the data bits. Accordingly, the out of band Hamming code may provide the same level of protection as a normal Hamming code, but the arbiter circuit 260 (and other components that utilize the out of band Hamming code) may include relatively simpler comparison logic to check the out of band Hamming code because all of the bits of the out of band Hamming code are arranged together.

The arbiter circuit 260 is configured to transmit the Hamming code through the common data path 262 to all recipients of the data. In addition, all components of the MSMC 200 that utilize the data are configured to calculate a test Hamming code based on the data and compare the test Hamming code to the Hamming code to determine whether any bit errors have occurred in the data. In response to detecting no error, the components are configured to utilize the data as normal. Each component in the MSMC 200 that utilizes data is configured to, in response to detecting a single bit error to correct the bit error in the data based on a difference between the test Hamming code and the Hamming code and utilize the corrected data as normal. Each component in the MSMC 200 that utilizes data may be configured to, in response to detecting a multi bit error to return an error code. As used herein, a device "utilizes" data when the device writes the data to memory or outputs the data from the MSMC 200. Accordingly, the RMW queues 902 utilize data when writing the data to the RAM banks 218 or to the external memory interleave 220. Further, the external memory interleave 220 utilizes the data when writing the data to external memory. In addition, the arbitration and data path manager 204 utilizes data when outputting the data to the coherent slave interfaces 206. The Hamming code may be written to memory (e.g., by the RMW queues 902 or the external memory interleave 220) along with the data. Thus, the MSMC 200 is configured to protect data upon entry into the MSMC 200 and at every stage of use.

In addition, the MSMC 200 may protect memory addresses identified in memory access requests as well. For example, the arbiter circuit 260 may be configured to generate an address Hamming code for an address identified in a received memory access request. In cases in which the memory access request is a write request identifying data, the arbiter circuit 260 may transmit the address Hamming code with the data identified in the write request and the Hamming code of the data on the common data path 262. In cases in which the memory access request is a read request, the arbiter circuit 260 may transmit the address Hamming code with on the common data path 262.

Each component of the MSMC 200 configured to use the address identified in the memory access request is configured to calculate a test address Hamming code based on the address and compare the test address Hamming code to the address Hamming code. As with the Hamming codes described for data, the components of the MSMC 200 may be configured to correct single bit errors in the address based on a difference between the address Hamming code and the test Hamming code and may be configured to generate an error message in response to detecting a multi-bit error.

In response to write requests, the external memory interleave 220 and the RMW queues 920 are configured to write the address Hamming code and the Hamming code of the data to memory. In response to read requests, the external memory interleave 220 and the RMW queues 920 are configured to remove the address Hamming code by performing an exclusive OR operation on the address Hamming code stored in the memory and the address Hamming code of the address identified in the read request.

Thus, the MSMC 200 supports various error detection and correction techniques. The MSMC 200 may support additional error correction and detection techniques. For example, the coherency controller 224 may calculate and store a parity bit for each snoop filter state identified in the snoop filter banks 212.

Figure 18:
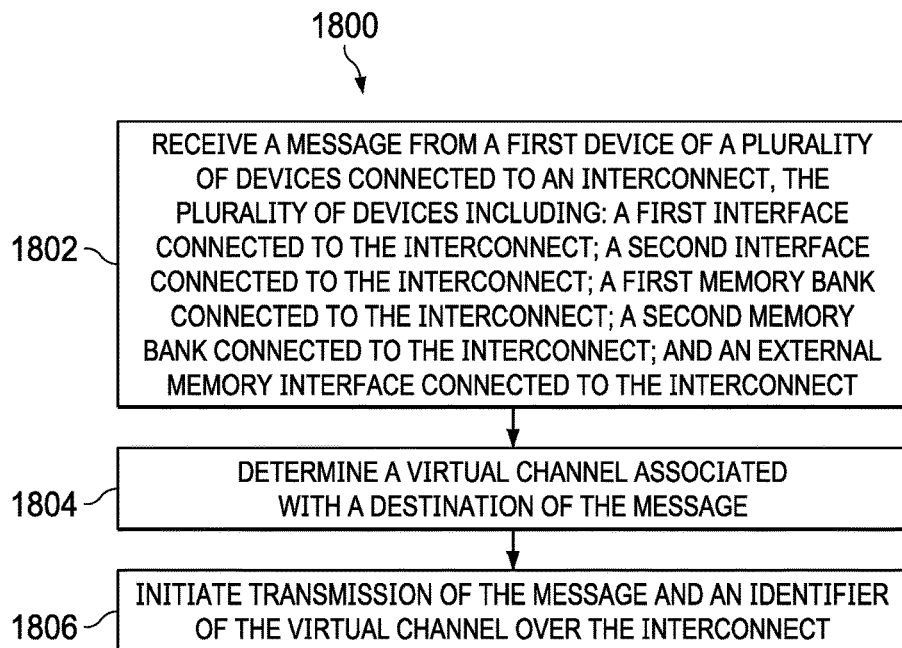
FIG. 18 is a flowchart of a method of transmitting messages on a shared interconnect.

Referring to FIG. 18, a flowchart of a method 1800 of transmitting messages on a shared interconnect is shown. The method 1800 may be performed by an arbiter circuit, such as the arbiter circuit 260 of FIG. 2. The method 1800 includes receiving a message from a first device of a plurality of devices connected to an interconnect, at 1802. The plurality of devices includes a first interface connected to the interconnect, a second interface connected to the interconnect, a first memory bank connected to the interconnect, a second memory bank connected to the interconnect, and an external memory interface connected to the interconnect. For example, the arbiter circuit 260 may receive a memory access request from one of the coherent slave interfaces 206 connected to the data path 262. The other coherent slave interfaces 206, the RAM banks 218, and the external memory master interfaces are connected to the data path 262.

The method 1800 further includes determining, at the controller, a virtual channel associated with a destination of the message, at 1804. For example, the arbiter circuit 260 may determine based on a memory address identified in the memory access request (and a snoop filter state associated with the memory address) an identity of a target of the memory access request. The arbiter circuit 260 may select a virtual channel associated with the target.

The method 1800 further includes initiating, at the controller, transmission of the message and an identifier of the virtual channel over the interconnect, at 1806. For example, the arbiter circuit 260 may add an identifier of the virtual channel to the memory access request and transmit the memory access request on the data path 262.

Thus, the method 1800 may be used by a circuit to provide virtual channels over a shared data path.

Figure 19:
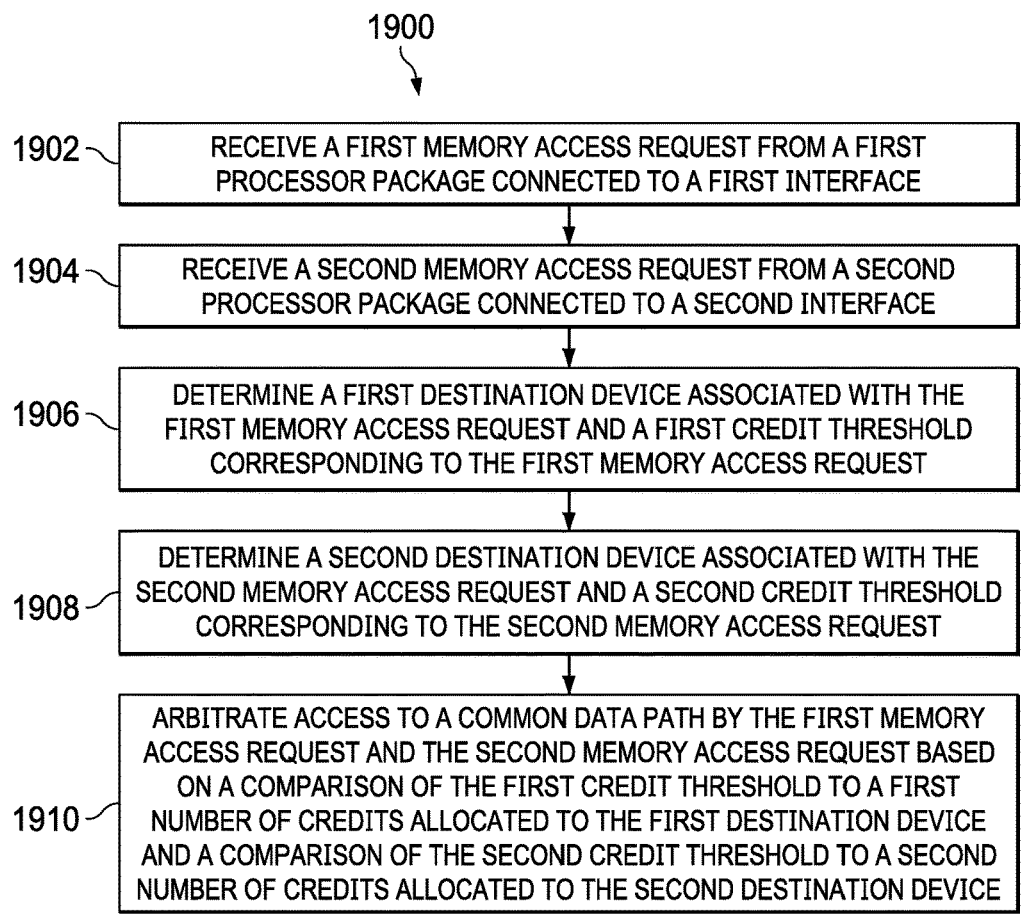
FIG. 19 is a flowchart of a method of arbitrating access to a common data path.

Referring to FIG. 19, a flowchart of a method 1900 of arbitrating access to a common data path is shown. The method 1900 includes receiving a first memory access request from a first processor package connected to a first interface, at 1902. For example, the arbiter circuit 260 may receive a first memory access request from the first coherent slave interface 206A connected to the data path 262.

The method 1900 further includes receiving a second memory access request from a second processor package connected to a second interface, at 1904. For example, the arbiter circuit 260 may receive a second memory access request from the eleventh coherent slave interface 206B connected to the data path 262.

The method 1900 further includes determining a first destination device associated with the first memory access request and a first credit threshold corresponding to the first memory access request, at 1906. For example, the arbiter circuit 260 may determine a destination device (e.g., one of the RMW queues 920 associated with the RAM banks 218) associated with the first memory access request based on an address included in the first memory access request, a state of the data cache provided by the RAM banks 218, and a state of the snoop filter banks 212. The arbiter circuit 260 may further determine a first credit threshold corresponding to the first memory access request based on a type of the first memory access request. For example, read requests may have a credit cost (e.g., a credit threshold) of 2 credits while write requests have a credit cost of 4 credits.

The method 1900 further includes determining a second destination device associated with the second memory access request and a second credit threshold corresponding to the second memory access request, at 1908. For example, the arbiter circuit 260 may determine a second destination device (e.g., one of the RMW queues 920 associated with the RAM banks 218) associated with the second memory access request based on an address included in the second memory access request, a state of the data cache provided by the RAM banks 218, and a state of the snoop filter banks 212. The arbiter circuit 260 may further determine a second credit threshold (e.g., credit cost) corresponding to the second memory access request based on a type of the second memory access request.

The method 1900 further includes arbitrating access to a common data path by the first memory access request and the second memory access request based on a comparison of the first credit threshold to a first number of credits allocated to the first destination device and a comparison of the second credit threshold to a second number of credits allocated to the second destination device, at 1910. For example, the arbiter circuit 260 may compare the first credit threshold to a number of credits available to the destination device of the first memory access request and compare the second credit threshold to a number of credits available to the destination device of the second memory access request. The arbiter circuit 260 may select a winner from among the memory access requests whose destination devices have a number of credits that satisfy the credit thresholds associated with the memory access requests.

Figure 20:
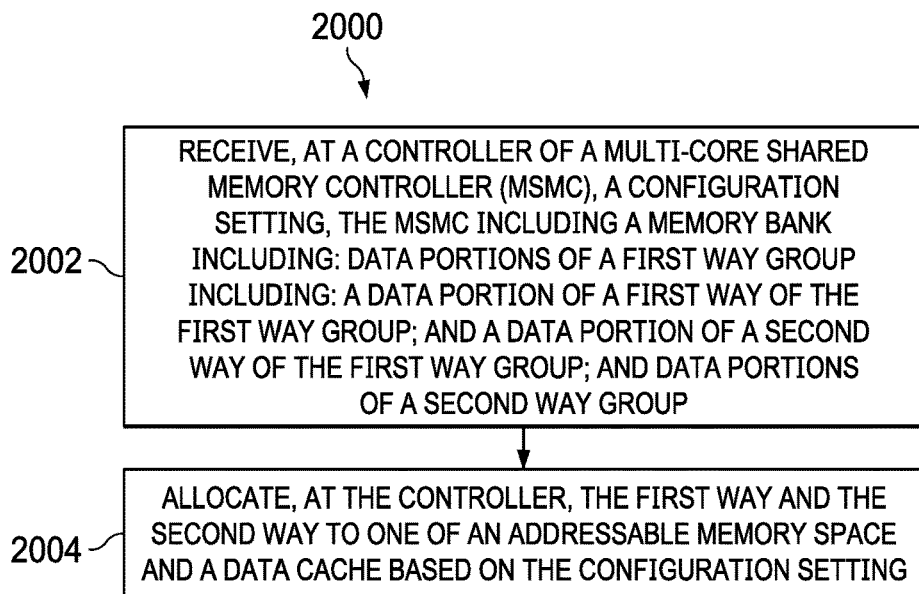
FIG. 20 is a flowchart of a method of allocating ways between addressable storage space and data cache space.

Referring to FIG. 20, a flowchart of a method 2000 of allocating ways between addressable memory space and a data cache is shown. The method 2000 includes receiving, at a controller of a multi-core shared memory controller (MSMC), a configuration setting, at 2002. The MSMC includes a memory bank including data portions of a first way group. The data portions of the first way group include a data portion of a first way of the first way group and a data portion of a second way of the first way group. The memory bank further includes data portions of a second way group. For example, the arbitration and data path manager 204 may receive a cache configuration setting from the cache configuration register 1204. The MSMC 200 includes the RAM bank 218A that stores data portions of a plurality of ways. The ways are arranged in groups (e.g., sets), as shown in FIG. 16.

The method 2000 further includes allocating, at the controller, the first way and the second way to one of an addressable memory space and a data cache based on the configuration setting, at 2004. For example, as illustrated in FIG. 16, the arbitration and data path manager 204 may independently allocate ways within a way group between addressable memory space and a data cache.

Figure 21:
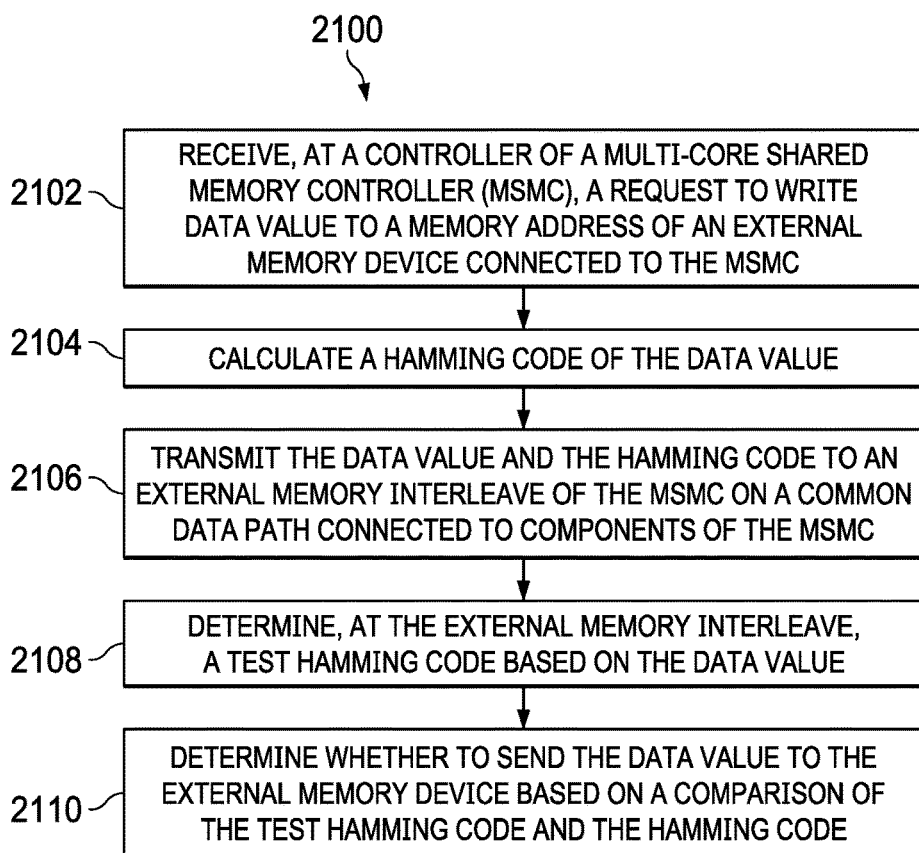
FIG. 21 is a flowchart of a method of protecting data within the MSMC.

Referring to FIG. 21, a method of protecting data within a memory controller is shown. The method 2100 includes receiving, at a controller of a multi-core shared memory controller (MSMC), a request to write a data value to a memory address of an external memory device connected to the MSMC, at 2102. For example, the arbiter circuit 260 may receive a write request from the first coherent slave interface 206A.

The method 2100 further includes calculating, a Hamming code of the data value, at 2104. For example, the arbiter circuit 260 may calculate a Hamming code of data included in the write request.

The method 2100 further includes transmitting the data value and the Hamming code to an external memory interleave of the MSMC on a common data path connected to components of the MSMC, at 2106. For example, the arbiter circuit 260 may transmit the data and the Hamming code to the external memory interleave 220 through the data path 262 (e.g., via one of the RMW queues 920).

The method 2100 further includes determining, at the external memory interleave, a test Hamming code based on the data value. The method further includes determining whether to send the data value to the external memory device based on a comparison of the test Hamming code and the Hamming code, at 2108. For example, the external memory interleave 220 may calculate a test Hamming code for the data and compare the test Hamming code with the Hamming code received with the data. In response to determining that the Hamming code is equal to the test Hamming code, the external memory interleave 220 may output the data to the external memory master interfaces 222 for writing to an external memory device. In response to detecting a single bit error, the external memory interleave 220 may correct the single bit error in the data based on a position of a difference in the test Hamming code and the Hamming code. In response to detecting a multi-bit error, the external memory interleave 220 may return an error message to the arbiter circuit 260 to be output to the first coherent slave interface 206A.

Thus, the method 2100 may be used to protect data transmitted within a memory interface.

Figure 22:
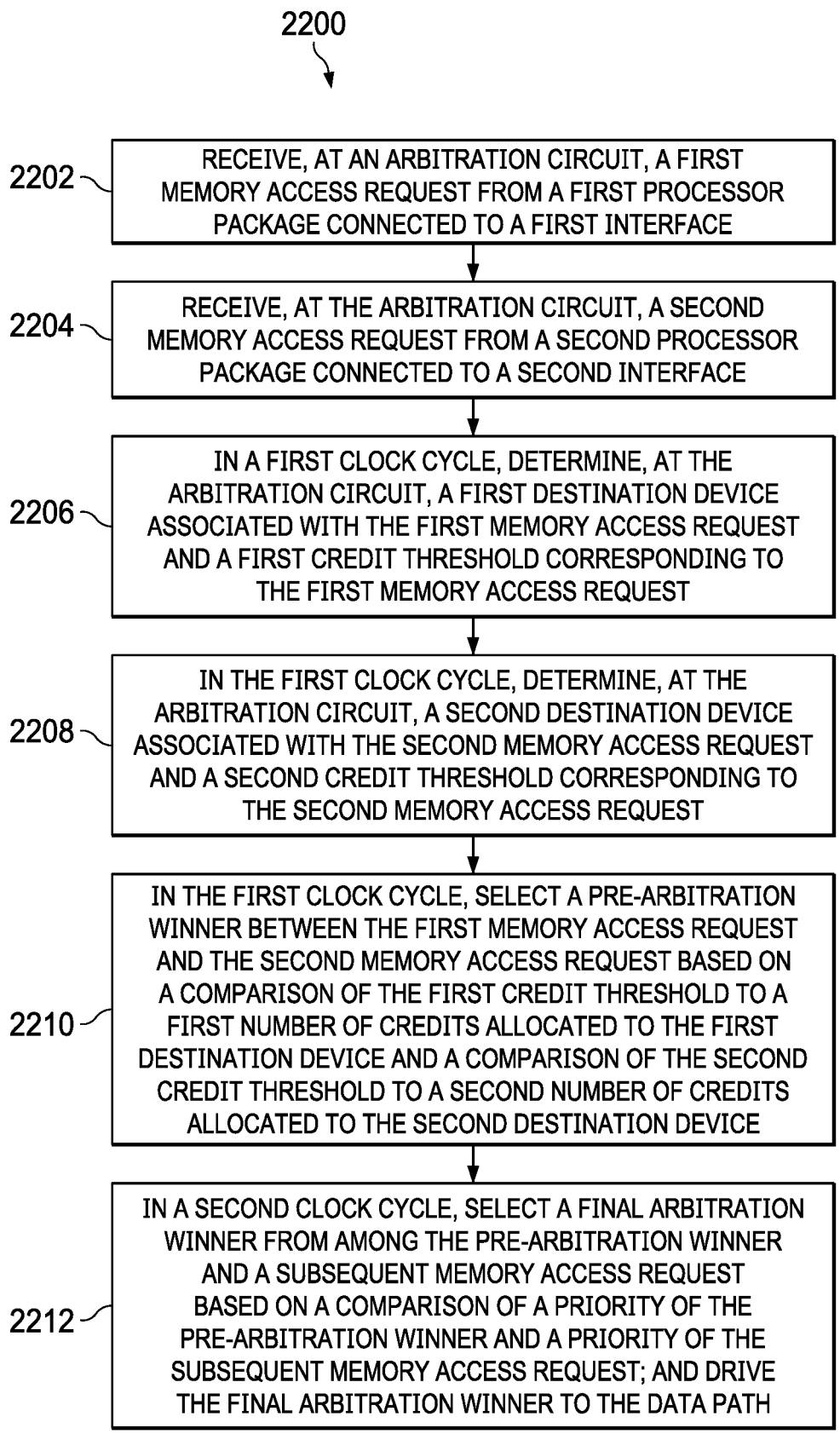
FIG. 22 is a flowchart of a method of performing two-step arbitration of access to a common data path.

Referring to FIG. 22, a flowchart of a method of performing two-step arbitration is shown. The method 2200 includes receiving, at an arbitration circuit, a first memory access request from a first processor package connected to a first interface, at 2202. For example, the arbiter circuit 260 may receive a first memory access request from the first coherent slave interface 206A connected to the data path 262.

The method 2200 further includes receiving, at the arbitration circuit, a second memory access request from a second processor package connected to a second interface, at 2204. For example, the arbiter circuit 260 may receive a second memory access request from the eleventh coherent slave interface 206B connected to the data path 262.

The method 2200 further includes, in a first clock cycle, determining, at the arbitration circuit, a first destination device associated with the first memory access request and a first credit threshold corresponding to the first memory access request, at 2206. For example, in a first clock cycle, the arbiter circuit 260 may determine a destination device (e.g., one of the RMW queues 920 associated with the RAM banks 218) associated with the first memory access request based on an address included in the first memory access request, a state of the data cache provided by the RAM banks 218, and a state of the snoop filter banks 212. The arbiter circuit 260 may further determine a first credit threshold corresponding to the first memory access request based on a type of the first memory access request. For example, read requests may have a credit cost (e.g., a credit threshold) of 2 credits while write requests have a credit cost of 4 credits.

The method 2200 further includes, in the first clock cycle, determining, at the arbitration circuit, a second destination device associated with the second memory access request and a second credit threshold corresponding to the second memory access request, at 2208. For example, in the first clock cycle, the arbiter circuit 260 may determine a second destination device (e.g., one of the RMW queues 920 associated with the RAM banks 218) associated with the second memory access request based on an address included in the second memory access request, a state of the data cache provided by the RAM banks 218, and a state of the snoop filter banks 212. The arbiter circuit 260 may further determine a second credit threshold (e.g., credit cost) corresponding to the second memory access request based on a type of the second memory access request.

The method 2200 further includes, in the first clock cycle, selecting a pre-arbitration winner between the first memory access request and the second memory access request based on a comparison of the first credit threshold to a first number of credits allocated to the first destination device and a comparison of the second credit threshold to a second number of credits allocated to the second destination device, at 2210. For example, in the first clock cycle, the arbiter circuit 260 may compare the first credit threshold to a number of credits available to the destination device of the first memory access request and compare the second credit threshold to a number of credits available to the destination device of the second memory access request. The arbiter circuit 260 may select a pre-arbitration winner from among the memory access requests whose destination devices have a number of credits that satisfy the credit thresholds associated with the memory access requests.

The method 2200 further includes, in a second clock cycle, selecting a final arbitration winner from among the pre-arbitration winner and a subsequent memory access request based on a comparison of a priority of the pre-arbitration winner and a priority of the subsequent memory access request and driving the final arbitration winner to the data path, at 2212. For example, in a second clock cycle, the arbiter circuit 260 may compare a priority of the pre-arbitration winner with a priority of a subsequently received memory access request and select a final arbitration winner. The arbiter circuit 260 may then drive the final arbitration winner on the data path 262.

Thus, the method 2200 describes a method of multi-step arbitration. The multi-step arbitration method may be used to pre-empt a pre-arbitration winner based on priority of a subsequently received request.

Figure 23:
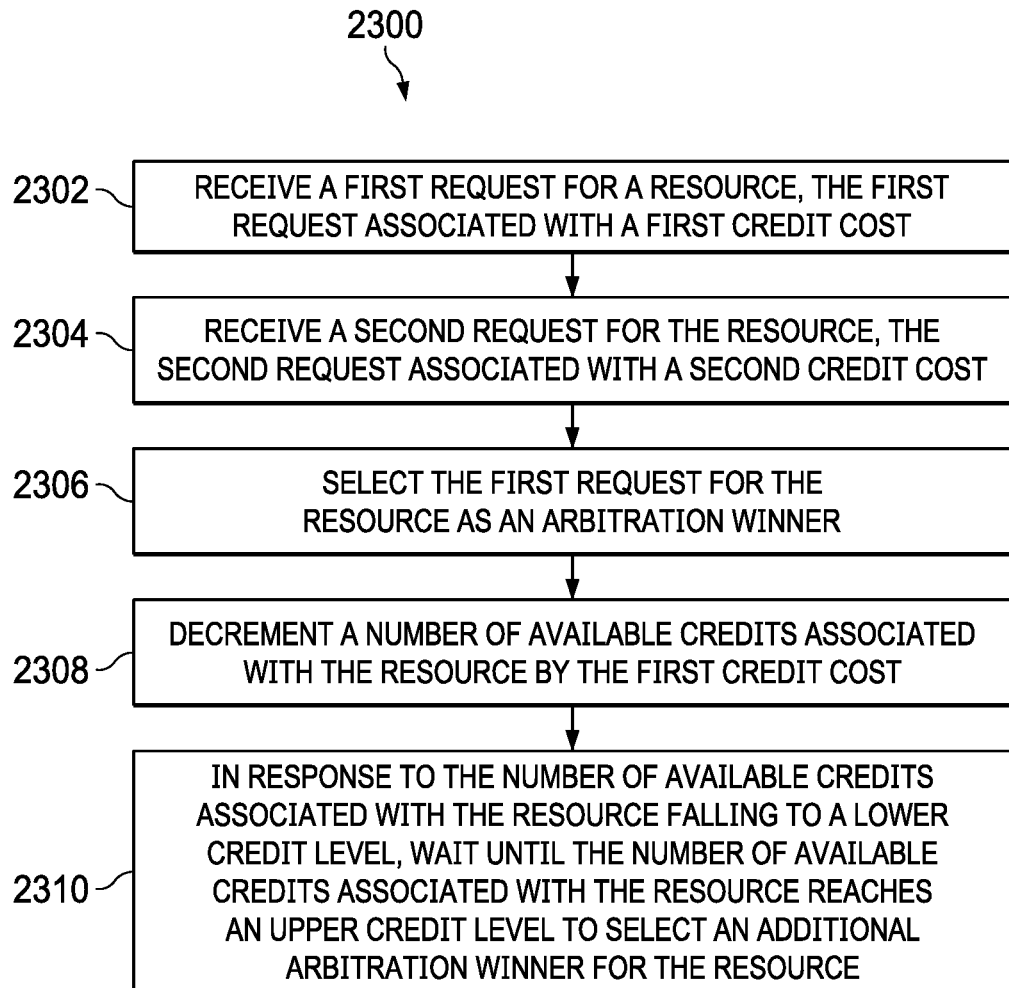
FIG. 23 is a method of hiding credits during credit based arbitration.

Referring to FIG. 23, a method 2300 of hiding credits during credit based arbitration is shown. The method 2300 may be performed by the arbiter circuit 260 or any other arbitration device in a credit based arbitration system. The method 2300 includes receiving a first request for a resource, at 2302. The first request is associated with a first credit cost. For example, the arbiter circuit 260 may receive a read request from the first coherent slave interface 206A. The arbiter circuit 260 may determine that the read request is to be transmitted to the first RMW queue 902A (e.g., based on an address identified in the read request and data from the coherency controller 224). The read request may have a cost of two credits.

The method 2300 further includes receiving a second request for the resource, at 2304. The second request is associated with a second credit cost. For example, the arbiter circuit 260 may receive a read write from the eleventh coherent slave interface 206B. The arbiter circuit 260 may determine that the write request is to be transmitted to the first RMW queue 902A (e.g., based on an address identified in the read request and data from the coherency controller 224). The write request may have a cost of four credits.

The method 2300 further includes selecting the first request for the resource as an arbitration winner, at 2306. For example, the arbiter circuit 260 may select the read request as the arbitration winner.

The method 2300 further includes decrementing a number of available credits associated with the resource by the first credit cost, at 2308. For example, the arbiter circuit 260 may decrement a number of available credits associated with the first RMW queue 902A from two credits to zero credits.

The method 2300 further includes in response to the number of available credits associated with the resource falling to a lower credit threshold, waiting until the number of available credits associated with the resource reaches an upper credit threshold to select an additional arbitration winner for the resource, at 2310. For example, in response to the number of available credits associated with the first RMW queue 902A falling to zero credits, the arbiter circuit 260 may wait until the number of credits available credits associated with the first RMW queue 902A reaches four credits before selecting a next arbitration winner to be sent to the first RMW queue 902A.

Thus, the method 2300 may be used by an arbiter to hide credits for a resource until a number of credits available for the resource meets an upper threshold. This may prevent lower cost requests from monopolizing the resource. In some implementations, the method 2300 includes setting the upper credit threshold based on heuristics at each moment in time. For example, the arbiter circuit may scale the upper credit threshold to equal the credit cost of the currently arbitrating request with the highest credit cost.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims. While the specific embodiments described above have been shown by way of example, it will be appreciated that many modifications and other embodiments will come to the mind of one skilled in the art having the benefit of the teachings presented in the foregoing description and the associated drawings. Accordingly, it is understood that various modifications and embodiments are intended to be included within the scope of the appended claims. For example, various methods and operations described herein may be performed individually or in combination by devices other than those depicted.

What is claimed is:

1. A circuit comprising:
a cache configuration register; and
a controller coupled to the cache configuration register, the controller configured to:
receive a random allocation pointer;
retrieve an AND mask from the cache configuration register;
retrieve an OR mask from the cache configuration register;
perform a first AND operation with a first bit of the random allocation pointer and a first AND mask bit to generate a first output bit;
perform a second AND operation with a second bit of the random allocation pointer and a second AND mask bit to generate a second output bit;
perform a first OR operation with the first output bit and a first OR mask bit to generate a first way identifier bit; and
perform a second OR operation with the second output bit and a second OR mask bit to generate a second way identifier bit.

2. The circuit of claim 1, wherein:
a set of most significant bits of the random allocation pointer is a way group identifier.

3. The circuit of claim 2, wherein:
the set of most significant bits of the random allocation pointer includes three most significant bits.

4. The circuit of claim 2, wherein:
the controller is configured to allocate a way to one of an addressable memory space and a data cache; and
the way is allocated based on the first way identifier bit, the second way identifier bit, and the way group identifier.

5. The circuit of claim 1, wherein:
the controller is configured to receive a memory access request from a requesting device; and
the controller retrieves the AND mask and the OR mask based on a characteristic of the requesting device.

6. The circuit of claim 5, wherein:
the characteristic is one of real-time or non-real-time.

7. The circuit of claim 5, wherein:
the way is allocated to a cache tag associated with the memory access request based on the first way identifier bit, the second way identifier bit, and a way group identifier.

8. A method comprising:
receive, by a controller, a random allocation pointer;
retrieving, by the controller, an AND mask from a cache configuration register coupled to the controller;
retrieving, by the controller, an OR mask from the cache configuration register;
performing, by the controller, a first AND operation with a first bit of the random allocation pointer and a first AND mask bit to generate a first output bit;
performing, by the controller, a second AND operation with a second bit of the random allocation pointer and a second AND mask bit to generate a second output bit;
performing, by the controller, a first OR operation with the first output bit and a first OR mask bit to generate a first way identifier bit; and performing, by the controller, a second OR operation with the second output bit and a second OR mask bit to generate a second way identifier bit.

9. The method of claim 8, wherein:
a set of most significant bits of the random allocation pointer is a way group identifier.

10. The method of claim 9, wherein:
the set of most significant bits of the random allocation pointer includes three most significant bits.

11. The method of claim 9, further comprising:
allocating, by the controller, a way to one of an addressable memory space and a data cache; wherein the way is allocated based on the first way identifier bit, the second way identifier bit, and the way group identifier.

12. The method of claim 8, further comprising:
receiving, by the controller, a memory access request from a requesting device;
wherein the controller retrieves the AND mask and the OR mask based on a characteristic of the requesting device.

13. The method of claim 12, wherein:
the characteristic is one of real-time or non-real-time.

14. The method of claim 12, further comprising:
allocating, by the controller, the way to a cache tag associated with the memory access request based on the first way identifier bit, the second way identifier bit, and a way group identifier.

15. A system comprising:
a memory;
a cache configuration register; and
a controller coupled to the cache configuration register and the memory, the controller configured to:
receive a random allocation pointer;
retrieve an AND mask from the cache configuration register;
retrieve an OR mask from the cache configuration register;
perform a first AND operation with a first bit of the random allocation pointer and a first AND mask bit to generate a first output bit;
perform a second AND operation with a second bit of the random allocation pointer and a second AND mask bit to generate a second output bit;
perform a first OR operation with the first output bit and a first OR mask bit to generate a first way identifier bit; and
perform a second OR operation with the second output bit and a second OR mask bit to generate a second way identifier bit.

16. The system of claim 15, wherein:
a set of most significant bits of the random allocation pointer is a way group identifier.

17. The system of claim 16, wherein:
the set of most significant bits of the random allocation pointer includes three most significant bits.

18. The system of claim 16, wherein:
the controller is configured to allocate a way to one of an addressable memory space and a data cache; and
the way is allocated based on the first way identifier bit, the second way identifier bit, and the way group identifier.

19. The system of claim 15, wherein:
the controller is configured to receive a memory access request from a requesting device; and
the controller retrieves the AND mask and the OR mask based on a characteristic of the requesting device.

20. The system of claim 19, wherein:
the way is allocated to a cache tag associated with the memory access request based on the first way identifier bit, the second way identifier bit, and a way group identifier.

* * * * *